United States Patent [19]

Hayashi

[11] Patent Number: 5,849,422
[45] Date of Patent: Dec. 15, 1998

[54] SPIN VALVE FILM

[75] Inventor: Kazuhiko Hayashi, Tokyo, Japan

[73] Assignee: NEC Corporation, Tokyo, Japan

[21] Appl. No.: 932,700

[22] Filed: Sep. 18, 1997

Related U.S. Application Data

[63] Continuation of Ser. No. 407,375, Mar. 20, 1995, abandoned.

[30] Foreign Application Priority Data

Mar. 24, 1994 [JP] Japan .................................... 6-053685

[51] Int. Cl.$^6$ ........................................................ G11B 5/39
[52] U.S. Cl. ........................... 428/611; 428/627; 428/632; 428/634; 428/668; 428/681; 428/928; 428/469
[58] Field of Search .................................. 428/611, 928, 428/692, 693, 621, 627, 634, 632, 668, 681, 637, 469

[56] References Cited

U.S. PATENT DOCUMENTS

| | | | |
|---|---|---|---|
| 4,103,315 | 7/1978 | Hempstead et al. ..................... | 428/928 |
| 4,621,030 | 11/1986 | Uesaka et al. ........................... | 428/928 |
| 4,809,109 | 2/1989 | Howard et al. .......................... | 428/611 |
| 4,949,039 | 8/1990 | Grunberg ................................. | 324/252 |
| 5,159,513 | 10/1992 | Dieny et al. ............................. | 360/113 |
| 5,206,590 | 4/1993 | Dieny et al. ............................. | 324/252 |
| 5,301,079 | 4/1994 | Cain et al. ............................... | 360/113 |
| 5,373,238 | 12/1994 | McGuire et al. ........................ | 360/113 |
| 5,408,377 | 4/1995 | Gurney et al. .......................... | 360/113 |
| 5,473,492 | 12/1995 | Terunuma et al. ...................... | 360/113 |
| 5,493,465 | 2/1996 | Kamiguchi et al. .................... | 360/113 |
| 5,688,605 | 11/1997 | Iwasaki et al. .......................... | 428/611 |
| 5,712,751 | 1/1998 | Yoda et al. .............................. | 360/113 |
| 5,739,987 | 4/1998 | Yuan et al. .............................. | 360/113 |

OTHER PUBLICATIONS

Y. Kamo et al, "Fabrication of an inductor using amorphous films with a multilayered structure", *Journal of Applied Physics*, vol. 64, No. 10, Nov. 15, 1988, pp. 5673–5675.

E. Sugawara et al., "Magnetic Properties of Composite Anisotropy CoNbZr/Ceramics Multi–Layers", *IEEE Translation Journal of Magnetics in Japan*, vol. 7, No. 12, Dec. 1992, pp. 969–974.

Kenneth T–Y. Kung et al, "MnFe structure–exchange anisotropy relation in the NiFe/MnFe/NiFe system", *Journal of Applied Physics*, vol. 69, No. 8, Apr. 15, 1992, pp. 5634–5636.

S. Soeya et al., "Magnetic . . . bilayered $Ni_{81}Fe_{19}$/NiO and trilayered $Ni_{81}Fe_{19}$/NiFeNb/NiO films", *Journal of Applied Physics*, vol. 74, No. 10, Nov. 15, 1993, pp. 6297–6301.

Patent Abstracts of Japan, vol. 18, No. 564 (P–1819), Oct. 27, 1994.

*Primary Examiner*—John J. Zimmerman
*Attorney, Agent, or Firm*—Sughrue, Mion, Zinn, Macpeak & Seas, PLLC

[57] ABSTRACT

Disclosed is a spin valve film having a first magnetic layer, a non-magnetic layer, a second magnetic layer, and an antiferromagnetic layer as the fundamental structure for the film. In such structure of the spin valve film, a single-layered film or a multi-layered film consisting of CoZrNb, CoZrMo, FeSiAl or FeSi, or a material prepared by adding Cr, Mn, Pt, Ni, Cu, Ag, Al, Ti, Fe, Co or Zn to the above-mentioned substance is used for at least one of the first magnetic layer and second magnetic layer. According to the present invention, a thin spin valve film having a good sensitivity with respect to magnetic field and a significant magnetoresistive effect can be obtained. When using this thin film for a shield reproducing head or a yoke reproducing head, the maximum reproducing output obtainable is approximately four times that of a reproducing head which utilizes the magnetoresistive effect provided by the application of the prior art.

21 Claims, 2 Drawing Sheets

1 substrate
2 buffer layer
3 first magnetic layer
4 non-magnetic layer
5 second magnetic layer
6 antiferromagnetic layer
7 protective layer

1 substrate
2 buffer layer
3 first magnetic layer
4 non-magnetic layer
5 second magnetic layer
6 antiferromagnetic layer
7 protective layer

SPIN VALVE FILM

This is a Continuation of application Ser. No. 08/407,375 filed Mar. 20, 1995 now abandoned.

BACKGROUND OF THE INVENTION

1. Field of the Invention

The present invention relates to a magnetic head which utilizes the magnetoresistive effect.

2. Description of the Related Art

With regard to the magnetic field sensor which utilizes the variation of the magnetoresistance of a multi-layered thin film formed by laminating magnetic metal and non-magnetic conductive material, an idea is disclosed in the specification of U.S. Pat. No. 4,949,039. A spin valve film results from the development of such idea thus disclosed, and it is obtained by fixing the magnetization of a magnetic layer on one side by the provision of an antiferromagnetic layer adjacent to it. Thus, the spin valve film belongs to the subordinate conception disclosed in the U.S. Pat. No. 4,949,039. For the spin valve film, the fundamental conception is also disclosed in U.S. Pat. No. 5,206,590. In this disclosure, as materials forming each layer of the spin valve film, Co, Fe, Ni, NiFe, FeCo and NiCo are introduced as the thin film layer of the ferromagnetic elements, and Au, Ag, Cu, Pt, Pd, Cr and Ta, as the non-magnetic metallic elements, and FeMn, as the antiferromagnetic layer.

When NiFe is used for the spin valve film using a conventional substrate or base layer, the variation of the magnetoresistive rate for the spin valve film is made greater from 5 to 10%, but the magnetic characteristic of the NiFe varies greatly depending on crystallinity. Therefore, in order to materialize the rood sensitivity with respect to magnetic field, it is necessary to reduce the oxygen concentration in a target, and back pressure when forming a film, and to make the temperature of a substrate high and constant. Accordingly, the target purity must be enhanced, and thus, the purchase price of the target is inevitably increased. In order to reduce the back pressure at the time of film formation, a vacuum pump, a chamber and other expensive equipment are required for maintaining a high vacuum condition. Further, while a heater and other equipment are needed in the interior of the vacuum device for raising the temperature of the substrate, a heavy load is applied to the bearing and others provided for the self-revolving equipment to rotate the substrate. Such an arrangement is indispensable to obtain a thin uniform film. Also, such equipment must be operated at a high temperature, and consequently, the replacement of parts should be made more frequently, leading to an increased running cost. In addition, in order to reduce the back pressure at the time of film formation, the substrate must be left to stand for a long time after it has been set until the film formation begins, and then, the temperature of the substrate is made high in order to form the film. Therefore, after completion of the film formation, a long cooling period is needed until the spin valve film formed on the substrate can be released. To meet these requirements, it is inevitable that the frequency of film formation per unit period should be limited, thus hindering the implementation of its production on a large scale. Therefore, in order to reduce the cost of the film formation, it is necessary to obtain a magnetic material which enables the provision of good crystal more easily than NiFe or to obtain a buffer layer or a substrate on which crystal is easily grown so that NiFe can obtain a good magnetic characteristic if the NiFe should be used eventually.

In the prior art, Cu is used for the non-magnetic layer. In the cases where the Cu is used, it is necessary to increase the purity of the Cu target, to reduce the back pressure at the time of film formation, and to control the temperature of the substrate also at the time of film formation as in the case of the magnetic film. This arrangement inevitably leads to the increased cost of manufacturing. In order to reduce the manufacturing cost, it is required to obtain a non-magnetic material which enables the provision of a good MR characteristic more easily than the Cu. If the Cu should be used, there is a need for the arrangement of a substrate or buffer layer capable of promoting its crystal growth to obtain a good MR characteristic.

According to the prior art, FeMn is actually used as the antiferromagnetic material. While the FeMn and NiFe provide an exchange coupling in a good condition, there is a disadvantage that FeMn is easily subjected to oxidation. Here, in order to enhance reliability, it is necessary to obtain in place of FeMn an antiferromagnetic material which is not easily oxidized in the air and the characteristics of which are not easily deteriorated, or if the FeMn should be used, it is required to provide a protective film to prevent the FeMn layer from being in contact with the air so that it may be oxidized with difficulty.

SUMMARY OF THE INVENTION

It is an object of the present invention to provide a spin valve film which is superior to the conventional one in terms of the reliability and the manufacturing cost, and also, is capable of presenting a higher MR ratio and a better characteristics of the head output than those of the conventional spin valve film.

In a spin valve film having a first magnetic layer/a non-magnetic layer/a second magnetic layer/an antiferromagnetic layer as its fundamental structure of the film, a single-layered film or a multi-layered film formed of CoZrNb, CoZrMo, FeSiAl or FeSi is used for at least one of the first magnetic layer and the second magnetic layer. It may be possible to use for the non-magnetic layer a single-layered film or a multi-layered film formed of a single substance selected from Al, Si, Ti, Ir, V, Cu, Zn, Zr, Nb, Mo, Pd, Ag, Sn, Hf, Ta, W, Pt, Au, Pb, Bi, C and silicon carbide or a mixture thereof. As the antiferromagnetic layer, a single-layered film or a multi-layered film formed of a single substance selected from FeMn, NiO, CoO, FeO, $Fe_2O_3$, MnO, CrO, Cr and Mn, a mixture thereof, or a material prepared by adding to the substance or mixture Mo, W, V, Ir, Nb, Ta, Mn, Tc, Re, Ru, Rh, Fe, Co, Ni, Pt, Pd, Au, Ag or Cu may be used. For the first or second magnetic layer, a single-layered film or a multi-layered film formed of a material to which Cr, Mn, Pt, Ni, Ir, Cu, Ag, Al, Ti, Fe, Co or Zn is added may be used.

Or, in a spin valve film having a first magnetic layer/a non-magnetic layer/a second magnetic layer/an antiferromagnetic layer as its fundamental structure of the film, at least one of the first magnetic layer and the second magnetic layer is formed of either NiFe or NiFeCo, and for the non-magnetic layer, a single-layered film or a multi-layered film formed of a single substance selected from Al, Si, Ti, Ir, V, Zn, Zr, Nb, Mo, Pd, Ag, Sn, Hf, Ta, W, Pt, Au, Pb, Bi, C or silicon carbide or a mixture thereof is used. In this case, as the antiferromagnetic layer, a single-layered film or a multi-layered film formed of a single substance selected from CoO, FeO, $Fe_2O_3$, MnO, CrO, Cr and Mn, a mixture thereof, or a material prepared by adding Mo, W, V, Ir, Nb, Ta, Mn, Tc, Re, Ru, Rh, Fe, Co, Ni, Pt, Pd, Au, Ag or Cu to the substance or the mixture may be used. It may be possible to provide a constitution in which the first magnetic layer or the antiferromagnetic layer is in contact with the substrate or the buffer layer formed on the substrate. It may also be possible to arrange a constitution in which a protective layer is provided on the outermost layer.

In addition, at least one of the first magnetic layer and the second magnetic layer may be formed of CoZrNb, CoZrMo, FeSiAl or FeSi, and for the substrate, a single-layered film or a multi-layered film may be formed of glass, ceramic, metal, metallic compound or plastic, or a mixture of these materials. A single-layered film or a multi-layered film formed of a single substance selected from Ta, Hf, Si, Au, Pt, Ag, Cu, Ti, Mn, Cr, Al, Si nitride, Si oxides, Al oxide, AlN, Al nitride, SiC and C or a mixture thereof may be used for the buffer layer. For the protective layer, a single-layered film or a multi-layered film formed of Ta, Hf, Si, Au, Pt, Ag, Cu, Mn, Ti, Cr, Al, Si nitride, Si oxides, Al oxide, Al nitride, SiC, C or diamond-like carbon, or a mixture or alloy of these substances may be used. At least one of the first magnetic layer and the second magnetic layer is formed of NiFe or NiFeCo, and fundamentally, it may be possible to use a single-layered film or a multi-layered film formed of ceramic, metal, metallic compound or plastic or a mixture of these materials. For the buffer layer, a single-layered film or a multi-layered film formed of a single substance selected from Si, Au, Pt, Ag, Cu, Ti, Mn, Cr, Al, $Si_3N_4$, Si nitride, $SiO_2$, Si nitride, $Al_2O_3$, Al oxide, AlN, Al nitride, SiC, C and diamond-like carbon or a mixture thereof may be used. For the protective layer, a single-layered film or a multi-layered film formed of Ta, Hf, Si, Au, Pt, Ag, Ti, Cr, Al, Si nitride, Si oxides, Al oxide, Al nitride, SiC, C or diamond-like carbon, or a mixture or alloy thereof. The film thickness of at least one of the first magnetic layer and the second magnetic layer may be 5 to 30 nm. The film thickness of the non-magnetic layer may be 2 to 5 nm. The film thickness of the antiferromagnetic layer may be 10 to 100 nm. The film thickness of the metallic protective layer may be 3 nm or less. The film thickness of the non-metallic protective layer may be 2 nm or more. The film thickness of the metallic buffer layer may be 15 nm or less. The film thickness of the non-metallic buffer layer may be 5 nm or more.

CoZrNb and CoZrMo, and a material obtained by adding Cr, Mn, Pt, Ni, Cu, Ag, Ir, Al, Ti, Fe, Co or Zn to CoZrNb or CoZrMo become amorphous when film formation is performed using usual sputtering. Therefore, if any of the above-mentioned material is used for a substrate or a buffer layer, good magnetic characteristics can be obtained even in the case where special attention is not paid to the back pressure during the film formation and target purity as compared to the case where NiFe and others are used. Also, since FeSiAl and FeSi are materials having body-centered cubic structure, and good crystallinity, it is easier to form a film having a good crystal, and obtain a good magnetic characteristic if such materials are used.

Also, when Ag, Au, an alloy of Ag and Au or a material prepared by adding to Ag or Au a single substance selected from Al, Si, Ti, Ir, V, Cu, Zn, Zr, Nb, Mo, Pd, Sn, Hf, Ta, W, Pt, Pb, Bi and C or some of the substances in combination is used for the non-magnetic layer, the current characteristic of the film hardly changes with time because the Ag or Au is a material which is hardly oxidized, and presents a nature which does not allow the interfacial diffusion to occur easily between the magnetic layer and the non-magnetic layer due to its wettability. Also, when a material prepared by adding to Cu a single substance selected from Al, Si, Ti, Ir, V, Zr, Nb, Mo, Pd, Sn, Hf, Ta, W and Bi or a plurality of the substances is used for the non-magnetic layer, the reliability is enhanced because the element thus added can adsorb the element such as oxygen that may promote the change of the current characteristic with passage of time. Also, when Ti, Ir, V, Zn, Pd, Sn, Hf, Ta, W, Pt, Pb, Bi or C is added to Cu, it is anticipated that these elements function to moderate the interfacial diffusion of the Cu to the magnetic layer.

In addition, among the antiferromagnetic materials, a single substance selected from NiO, CoO, FeO, $Fe_2O_3$, MnO and CrO, a mixture thereof, or a material prepared by adding to the substance or mixture Mo, W, V, Ir, Nb, Ta, Mn, Tc, Re, Ru, Rh, Fe, Co, Ni, Pt, Pd, Au, Ag or Cu is stable in the air because the main component thereof is an oxide. The single substance of Cr and Mn, a mixture thereof or a material prepared by adding to the substance or mixture Mo, W, V, Ir, Nb, Ta, Mn, Tc, Re, Ru, Rh, Fe, Co, Ni, Pt, Pd, Au, Ag or Cu is stable in the air because both Mn and Cr are materials which are comparatively hardly oxidized although the main component is metal.

When a single-layered film or a multi-layered film formed of Ta, Hf, Si, Au, Pt, Ag, Cu, Mn, Ti, Cr, Al, Si nitride, Si oxides, Al oxide, Al nitride, SiC, C or diamond-like carbon, or a mixture or alloy of these substances is used as a protective layer on the outermost layer, the protective layer functions to prevent the magnetic layer, non-magnetic layer, and antiferromagnetic layer from being in contact with the air. Therefore, the reliability of the spin valve film can be securely obtained even when a material that may comparatively be oxidized easily is used for the magnetic layer, non-magnetic layer, and antiferromagnetic layer.

When a crystalline material is used for the magnetic layer and non-magnetic layer, the combination of substrate and buffer layer affects the crystallinity of the material although its degree depends on the material to be used. If the single substance of $Si_3N_4$, $SiO_2$, AlN and $Al_2O_3$, a mixture thereof, a laminated film or glass is used for the substrate, it is effective to use a single-layered film or a multi-layered film formed of the single substance of Au, Pt, Ag, Cu, Ti, Mn, Cr and Al or a mixture thereof for the buffer layer. When a plastic such as polycarbonate, vinyl chloride, polyimide, polyolefin, and a mixture or laminated film of these materials is used for the substrate, it is possible to obtain the similar effect as in the case where the single substance of $Si_3N_4$, $SiO_2$, AlN, $Al_2O_3$ and glass or a mixture thereof and a laminated film is used for a substrate if a single substance of silicon oxides, silicon nitride, aluminum oxide, aluminum nitride, other ceramics, glass, a mixture thereof, or a laminated film is formed on the substrate as a first buffer layer, and further thereon, a single-layered film or a multi-layered film formed of a single substance of Au, Pt, Ag, Cu, Ti, Mn, Cr and Al or a mixture thereof is provided as a second buffer layer. On the other hand, when an amorphous material such as CoZrNb and CoZrMo is used for the magnetic layer, it is possible to use for the buffer layer the single substance of Au, Pt, Ag, Cu, Ti, Mn, Cr, Al, silicon oxides, silicon nitride, aluminum oxide, aluminum nitride, other ceramics, glass, SiC, C, diamond-like carbon and the like, a mixture, or laminated film thereof because the buffer layer is not required to provide properties that may promote the crystallinity of the film.

If the film thickness of the magnetic layer is too small, it becomes difficult to allow a good inversion of spin to take place following the impression of the magnetic field. On the other hand, if it is too large, the magnitude of the coupled magnetic field becomes too small because the magnitude of the coupled magnetic field of the exchange coupling film is proportional to the film thickness. As a result, there is an appropriate range for setting a film thickness.

If the film thickness of the non-magnetic layer is too small, the exchange coupling between the first magnetic layer and the second magnetic layer becomes too strong. Therefore, it becomes difficult for the second magnetic layer to generate its inversion. On the other hand, if it is too large, the MR ratio of the spin valve film is lowered because the rate of dependency of the diffusion of electron in the direction of magnetization becomes small on the interface between the magnetic layer and non-magnetic layer. As a result, there is an appropriate range for setting a film thickness.

When a conductive protective layer and a conductive buffer layer are used, the electric resistance of the spin valve film is lowered as a whole, thus lowering the amount of change in the magnetoresistance if the film thickness is too large. The film thickness of the conductive protective layer and the buffer layer should not be too large.

If the non-conductive protective layer and buffer layer are used, it may be possible to make the film thickness larger to a certain extent because the amount of change in the magnetoresistance is not affected even when the film thickness is large. There are better cases where the film thickness is made larger to a certain extent taking the reliability and the crystal growth into consideration.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings, in which:

DETAILED DESCRIPTION OF THE PREFERRED EMBODIMENTS

Figure 1:
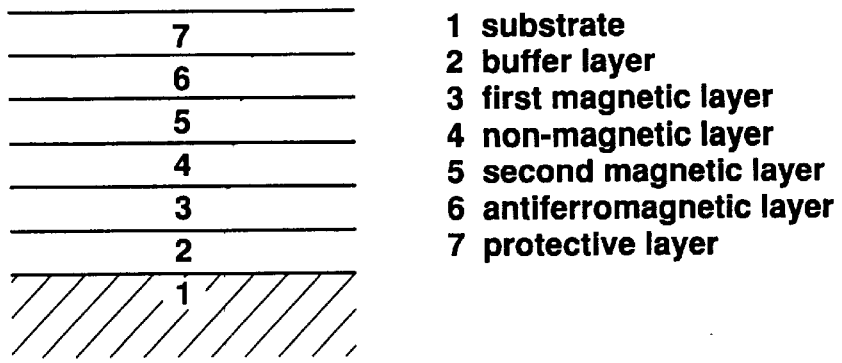
FIG. 1 is a conceptional view showing a spin valve film according to the present invention.

The present invention will be described below in detail by way of Examples.

EXAMPLE 1

In a structure shown in FIG. 1, a spin valve film was produced by changing the composition of the first magnetic layer and second magnetic layer as shown in Table 1, and using the antiferromagnetic layer of (1), (2) or (3) given below. Then, the inverted magnetic field and the rate of change of the magnetoresistance of the second magnetic layer were measured.

Next, using this spin valve film, a shield reproducing head and a yoke reproducing head were produced to conduct reading tests on a magnetic domain having a width of 0.3 $\mu$m recorded on a commercially available hard disk by use of an inductive head. The inverted magnetic field, the rate of change of the magnetoresistance, and the value of reproducing output of the second magnetic layer in this case are shown in each table. The same magnetic domain was reproduced by use of the conventional MR head to give the reproducing signal of 260 $\mu$V. Thus, the reproducing signal presented an improvement of two to four times.

(1) In the case where NiO is used for the antiferromagnetic layer:

a spin valve film was produced using glass as the substrate, silicon nitride as the buffer layer (10 nm), Cu as the non-magnetic layer (3 nm), NiO as the antiferromagnetic layer (30 nm) and copper as the protective layer (2 nm) and by changing the composition of the first and second magnetic layers as shown in Table 1 while their film thickness being made 15 nm in these cases. The result of measurement is also shown in Table 1.

Table 1

(2) In the case where FeMn is used for the antiferromagnetic layer:

a spin valve film was produced using glass as the substrate, silicon nitride as the buffer layer (10 nm), Cu as the non-magnetic layer (3 nm), FeMn as the antiferromagnetic layer (10 nm) and copper as the protective layer (2 nm) and by changing the composition of the first and second magnetic layers as shown in Table 2 while their film thickness being made 15 nm in these cases. The result of measurement is also shown in Table 2.

Table 2

(3) In the case where a mixture of CoO and Nio is used for the antiferromagnetic layer:

a spin valve film was produced using $Al_2O_3$ glass as the substrate, TA as the buffer layer (15 nm), Ag as the non-magnetic layer (3 nm), a mixture of CoO and NiO as the antiferromagnetic layer (40 nm) and copper as the protective layer (2 nm) and by changing the composition of the first and second magnetic layers as shown in Table 3 while their film thickness being made 12 nm and 16 nm, respectively. The result of measurement is also shown in Table 3.

Table 3

EXAMPLE 2

In the structure shown in FIG. 1, a spin valve film was produced by changing the composition of the non-magnetic layer and using the first and second magnetic layers of (1) and (2) given below. Then, the inverted magnetic field and the rate of change of magnetoresistance of the second magnetic layer were measured. Also, in the same manner as in Example 1, the inverted magnetic field, the rate of change of magnetoresistance, and the value of reproducing output of the second magnetic layer of shield and yoke reproducing heads were measured.

(1) In the case where FeSiAl is used for both the first and second magnetic layers:

a spin valve film was produced using $SiO_2$ as the substrate, Hf nitride as the buffer layer (10 nm), FeSiAl as the first magnetic layer (15 nm), FeSiAl as the second magnetic layer (20 nm) and a mixture of FeO, NiO and CoO as the antiferromagnetic layer (35 nm), and copper as the protective layer (2 nm) and by changing the composition of the non-magnetic layer as shown in Table 4 while its film thickness being made 3 nm in these cases. The result of measurement is also shown in Table 4.

Table 4

(2) In the case where FeSiAl is used for the first magnetic layer and NiFe for the second magnetic layer:

a spin valve film was produced using $SiO_2$ as the substrate, Al nitride as the buffer layer (10 nm), FeSiAl as the first magnetic layer (15 nm), NiFe as the second magnetic layer (13 nm), FeMn as the antiferromagnetic layer (8 nm) and copper as the protective layer (3 nm) and by changing the composition of the non-magnetic layer as shown in Table 5 while its film thickness being made 3 nm in these cases. The result of measurement is also shown in Table 5.

Table 5

EXAMPLE 3

In the structure shown in FIG. 1, a spin valve film was produced by changing the composition of the antiferromagnetic layer and using the first and second magnetic layers of (1) and (2) given below. Then, the inverted magnetic field and the rate of change of magnetoresistance of the second magnetic layer were measured. Also, in the same manner as in Example 1, the inverted magnetic field, the rate of change of magnetoresistance, and the value of reproducing output of the second magnetic layer of shield and yoke reproducing heads were measured.

(1) In the case where FeSiAl is used for the first magnetic layer and CoZrNb for the second magnetic layer:

a spin valve film was produced using glass as the substrate, Au as the buffer layer (8 nm), FeSiAl as the first magnetic layer (10 nm), Al as the non-magnetic layer (2.5 nm), CoZrNb as the second magnetic layer (16 nm) and copper as the protective layer (2 nm) and by changing the composition of the antiferromagnetic layer as shown in Table 6 while its film thickness being made 12 nm in these cases. The result of measurement is also shown in Table 6.

Table 6

(2) In the case where FeSiAl is used for the first magnetic layer and NiFeCo for the second magnetic layer:

a spin valve film was produced using glass as the substrate, $Si_2O_3$ as the buffer layer (11 nm), FeSiAl as the first magnetic layer (16 nm), Ag as the non-magnetic layer (3.5 nm), NiFe as the second magnetic layer (14 nm) and Ag as the protective layer (2 nm) and by changing the composition of the antiferromagnetic layer as shown in Table 7 while its film thickness being made 18 nm in these cases. The result of measurement is also shown in Table 7.

Table 7

EXAMPLE 4

In the structure shown in FIG. 1, a spin valve film was produced by using the antiferromagnetic layer of (1) or (2) given below and changing the elements to be added thereto.

Then, the inverted magnetic field and the rate of change of magnetoresistance of the second magnetic layer were measured. Also, in the same manner as in Example 1, the inverted magnetic field, the rate of change of magnetoresistance, and the value of reproducing output of the second magnetic layer of shield and yoke reproducing heads were measured.

(1) In the case where elements are added to the FeMn antiferromagnetic layer:

a spin valve film was produced using glass as the substrate, Pt as the buffer layer (15 nm), FeSiAl as the first magnetic layer (15 nm), Cu as the non-magnetic layer (2.5 nm), NiFe as the second magnetic layer (16 nm) and Ag as the protective layer (2 nm) and by adding various elements to the FeMn antiferromagnetic layer (12 nm) as shown in Table 8. The result of measurement is also shown in Table 8.

Table 8

(2) In the case where elements are added to the NiO antiferromagnetic layer:

a spin valve film was produced using glass as the substrate, a glass-sputtered film as the buffer layer (20 nm), NiFe as the first magnetic layer (20 nm), Ag as the non-magnetic layer (3 nm), NiFe as the second magnetic layer (20 nm) and Cu as the protective layer (2 nm) and by adding various elements to the NiO antiferromagnetic layer (17 nm) as shown in Table 9. The result of measurement is also shown in Table 9.

Table 9

EXAMPLE 5

In the structure shown in FIG. 1, a spin valve film was produced by changing the composition of the buffer layer and using the first and second magnetic layers of (1) and (2) given below. Then, the inverted magnetic field and the rate of change of magnetoresistance of the second magnetic layer were measured. Also, in the same manner as in Example 1, the inverted magnetic field, the rate of change of magnetoresistance, and the value of reproducing output of the second magnetic layer of shield and yoke reproducing heads were measured.

(1) In the case where the first magnetic layer is NiFe, and the second magnetic layer is FeSiAl:

a spin valve film was produced using glass as the substrate, NiFe as the first magnetic layer (15 nm), Al as the non-magnetic layer (3 nm), FeSiAl as the second magnetic layer (15 nm), FeMn as the antiferromagnetic layer (15 nm) and copper as the protective layer (2 nm) and by changing the composition of the buffer layer as shown in Table 10 while its film thickness being made 15 nm in these cases. The result of measurement is also shown in Table 10.

Table 10

(2) In the case where the first magnetic layer is NiFe and the second magnetic layer is CoZrNb:

a spin valve film was produced using glass as the substrate, NiFe as the first magnetic layer (15 nm), Cu as the non-magnetic layer (3 nm), CoZrNb as the second magnetic layer (15 nm), NiO as the antiferromagnetic layer (15 nm) and copper as the protective layer (2 nm) and by changing the composition of the buffer layer as shown in Table 11 while its film thickness being made 15 nm in these cases. The result of measurement is also shown in Table 11.

Table 11

EXAMPLE 6

In the structure shown in FIG. 1, a spin valve film was produced by changing the composition of the protective layer and using the antiferromagnetic layer of (1) and (2) given below. Then, the inverted magnetic field, and the rate of change of magnetoresistance of the second magnetic layer were measured. Also, in the same manner as in Example 1, the inverted magnetic field, the rate of change of magnetoresistance, and the value of reproducing output of the second magnetic layer of shield and yoke reproducing heads were measured.

(1) In the case where NiO is used for the antiferromagnetic layer:
   a spin valve film was produced using glass as the substrate, Hf as the buffer layer (10 nm), FeSiAl as the first magnetic layer (15 nm), Cu as the non-magnetic layer (3 nm), FeSiAl as the second magnetic layer (15 nm) and NiO as the antiferromagnetic layer (15 nm) and by changing the composition and thickness of the protective layer as shown in Table 12. The result of measurement is also shown in Table 12.

Table 12

(2) In the case where FeMn is used for the antiferromagnetic layer:
   a spin valve film was produced using glass as the substrate, $SiO_2$ as the buffer layer (10 nm), NiFe as the first magnetic layer (12 nm), Cu as the non-magnetic layer (3 nm), NiFe as the second magnetic layer (16 nm) and FeMn as the antiferromagnetic layer (15 nm) and by changing the composition and thickness of the protective layer as shown in Table 13. The result of measurement is also shown in Table 13.

Table 13

EXAMPLE 7

In the structure shown in FIG. 1, a spin valve film was produced by changing the material of the substrate and using the buffer layer of (1) and (2) given below. Then, the inverted magnetic field and the rate of change of magnetoresistance of the se cond magnetic layer were measured. Also, in the same manner as Example 1, the inverted magnetic field, the rate of change of magnetoresistance, and the value of reproducing output of the second magnetic layer of shield and yoke reproducing heads were measured.

(1) I n the case where Hf is used for t he buffer layer:
   a spin valve film was produced using Hf as the buffer layer (10 nm), FeSiAl as the first magnetic layer (17 nm), Cu as the non-magnetic layer (3 nm), FeSiAl as the second magnetic layer (17 nm), NiO as the antiferromagnetic layer (15 nm) and Cu as the protective layer (2 nm) and by changing the composition of the substrate as shown in Table 14. The result of measurement is also shown in Table 14.

Table 14

(2) In the case where $Si_3N_4$ is used for the buffer layer:
   a spin valve film was produced using $Si_3N_4$ as the buffer layer (80 nm), NiFe as the first magnetic layer (14 nm), Cu as the non-magnetic layer (3 nm), NiFe as the second magnetic layer (14 nm), FeMn as the antiferromagnetic layer (15 nm) and $Si_3N_4$ as the protective layer (80 nm) and by changing the composition of the substrate as shown in Table 15. The result of measurement is also shown in Table 15.

Table 15

EXAMPLE 8

In each of the elemental structures of the spin valve film shown in FIG. 1 to FIG. 8, the inverted magnetic field and the rate of change of magnetoresistance of 5.5% were measured for the second magnetic layer by use of the first and second magnetic layers of (1) and (2) given below.

Then, a shield reproducing head and a yoke reproducing head were produced using the respective spin valve films, and the reading tests were performed on the magnetic domain having a width of 0.3 µm recorded on a commercially available hard disk by use of an inductive head.

Figure 2:
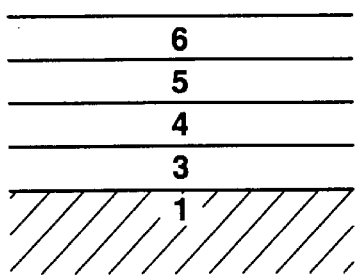
FIG. 2 is a conceptional view showing a spin valve film according to the present invention.
Figure 3:
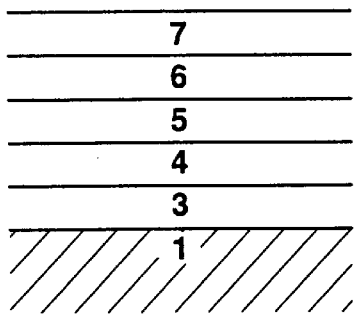
FIG. 3 is a conceptional view showing a spin valve film according to the present invention.
Figure 4:
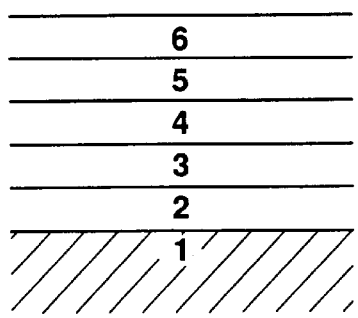
FIG. 4 is a conceptional view showing a spin valve film according to the present invention.

(1) In the case where the first magnetic layer is CoZrMo and the second magnetic layer is CoZrNb:
   (a) When a spin valve film was produced in the structure as shown in FIG. 1 using $Al_2O_3$ as the substrate, Ta as the buffer layer (10 nm), CoZrMo as the first magnetic layer (15 nm), Cu as the non-magnetic layer (3.5 nm), CoZrNb as the second magnetic layer (15 nm), NiO as the antiferromagnetic layer (50 nm) and Cu as the protective layer (2 nm), there were obtained the inverted magnetic field of 3oe and the rate of change of magnetoresistance of 5.5% for the second magnetic layer. The reproducing output value of the shield reproducing head and that of the yoke reproducing head were 890 µV and 960 µV, respectively.
   (b) When a spin valve film was produced in the structure as shown in FIG. 2 using $Al_2O_3$ as the substrate, CoZrMo as the first magnetic layer (15 nm), Cu as the non-magnetic layer (3.5 nm), CoZrNb as the second magnetic layer (15 nm) and NiO as the antiferromagnetic layer (50 nm), there were obtained the inverted magnetic field of 1oe and the rate of change of magnetoresistance of 5% for the second magnetic layer. The reproducing output value of the shield reproducing head and that of the yoke reproducing head were 870 µV and 920 µV, respectively.
   (c) When a spin valve film was produced in the structure as shown in FIG. 3 using $Al_2O_3$ as the substrate, CoZrMo as the first magnetic layer (15 nm), Cu as the non-magnetic layer (3.5 nm), CoZrNb as the second magnetic layer (15 nm), NiO as the antiferromagnetic layer (50 nm) and Cu as the protective layer (2 nm), there were obtained the inverted magnetic field of 2oe and the rate of change of magnetoresistance of 6% for the second magnetic layer. The reproducing output value of the shield reproducing head and that of the yoke reproducing head were 910 µV and 940 µV, respectively.
   (d) When a spin valve film was produced in the structure as shown in FIG. 4 using $Al_2O_3$ as the substrate, Ta as the buffer layer (10 nm), CoZrMo as the first magnetic layer (15 nm), Cu as the non-magnetic layer (3.5 nm), CoZrNb as the second magnetic layer (15 nm) and NiO as the antiferromagnetic layer (50 nm), there were obtained the inverted magnetic field of 2oe and the rate of change of magnetoresistance of 6% for the second magnetic layer. The reproducing output value of the shield reproducing head and that of the yoke reproducing head were 920 μV and 960 μV, respectively.

Figure 5:
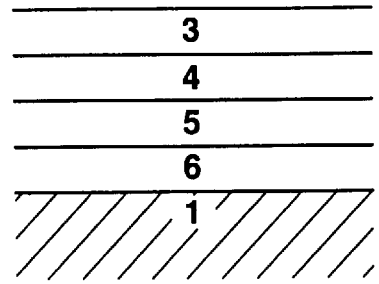
FIG. 5 is a conceptional view showing a spin valve film according to the present invention.

(e) When a spin valve film was produced in the structure as shown in FIG. 5 using Al$_2$O$_3$ as the substrate, CoZrMo as the first magnetic layer (15 nm), Cu as the non-magnetic layer (3.5 nm) and NiO as the antiferromagnetic layer (50 nm), there were obtained the inverted magnetic field of 2 Oe and the rate of change of magnetoresistance of 5% for the second magnetic layer. The reproducing output value of the shield reproducing head and that of the yoke reproducing head were 830 μV and 880 μV, respectively.

Figure 6:
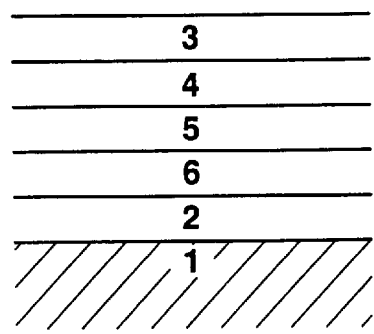
FIG. 6 is a conceptional view showing a spin valve film according to the present invention.

(f) When a spin valve film was produced in the structure as shown in FIG. 6 using Al$_2$O$_3$ as the substrate, Ta as the buffer layer (10 nm), CoZrMo as the first magnetic layer (15 nm), Cu as the non-magnetic layer (3.5 nm), CoZrNb as the second magnetic layer (15 nm) and NiO as the antiferromagnetic layer (50 nm), there were obtained the inverted magnetic field of 2 Oe and the rate of change of magnetoresistance of 5.5% for the second magnetic layer. The reproducing output value of the shield reproducing head and that of the yoke reproducing head were 870 μV and 860 μV, respectively.

Figure 7:
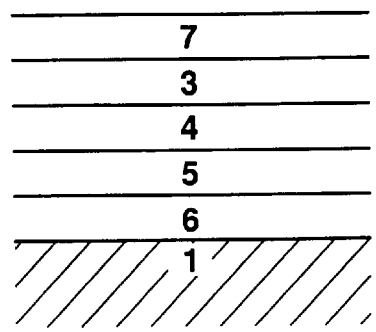
FIG. 7 is a conceptional view showing a spin valve film according to the present invention.

(g) When a spin valve film was produced in the structure as shown in FIG. 7 using Al$_2$O$_3$ as the substrate, CoZrMo as the first magnetic layer (15 nm), Cu as the non-magnetic layer (3.5 nm), CoZrNb as the second magnetic layer (15 nm), NiO as the antiferromagnetic layer (50 nm) and Cu as the protective layer (2 nm), there were obtained the inverted magnetic field of 2 Oe and the rate of change of magnetoresistance of 5.5% for the second magnetic layer. The reproducing output value of the shield reproducing head and that of the yoke reproducing head were 870 μV and 860 μV, respectively.

Figure 8:
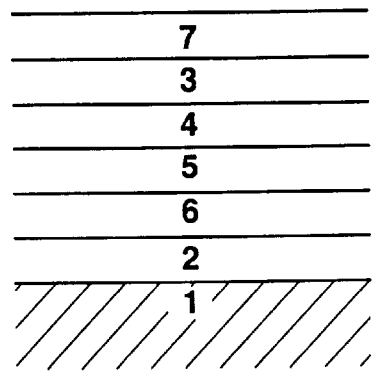
FIG. 8 is a conceptional view showing a spin valve film according to the present invention.

(h) When a spin valve film was produced in the structure as shown in FIG. 8 using Al$_2$O$_3$ as the substrate, Ta as the buffer layer (10 nm), CoZrMo as the first magnetic layer (15 nm), Cu as the non-magnetic layer (3.5 nm), CoZrNb as the second magnetic layer (15 nm), NiO as the antiferromagnetic layer (50 nm) and Cu as the protective layer (2 nm), there were obtained the inverted magnetic field of 3 Oe and the rate of change of magnetoresistance of 6% for the second magnetic layer. The reproducing output value of the shield reproducing head and that of the yoke reproducing head were 890 μV and 940 μV, respectively.

(2) In the case where both of the first and second magnetic layers are NiFe:

(a) When a spin valve film was produced in the structure as shown in FIG. 1 using glass as the substrate, Hf as the buffer layer (10 nm), NiFe as the first magnetic layer (15 nm), Ag as the non-magnetic layer (3 nm), NiFe as the second magnetic layer (15 nm) NiO as the antiferromagnetic layer (15 nm) and Cu as the protective layer (2 nm), there were obtained the inverted magnetic field of 2 Oe and the rate of change of magnetoresistance of 6.5% for the second magnetic layer. The reproducing output value of the shield reproducing head and that of the yoke reproducing head were 830 μV and 870 μV, respectively.

(b) When a spin valve film was produced in the structure as shown in FIG. 2 using glass as the substrate, NiFe as the first magnetic layer (15 nm), Ag as the non-magnetic layer (3 nm), NiFe as the second magnetic layer (15 nm) and NiO as the antiferromagnetic layer (15 nm), there were obtained the inverted magnetic field of 2 Oe and the rate of change of magnetoresistance of 5.5% for the second magnetic layer. The reproducing output value of the shield reproducing head and that of the yoke reproducing head were 770 μV and 840 μV, respectively.

(c) When a spin valve film was produced in the structure as shown in FIG. 3 using glass as the substrate, NiFe as the first magnetic layer (15 nm), Ag as the non-magnetic layer (3 nm), NiFe as the second magnetic layer (15 nm), NiO as the antiferromagnetic layer (15 nm) and Cu as the protective layer (2 nm), there were obtained the inverted magnetic field of 4 Oe and the rate of change of magnetoresistance of 6% for the second magnetic layer. The reproducing output value of the shield reproducing head and that of the yoke reproducing head were 690 μV and 750 μV, respectively.

(d) When a spin valve film was produced in the structure as shown in FIG. 4 using glass as the substrate, Hf as the buffer layer (10 nm), NiFe as the first magnetic layer (15 nm), Ag as the non-magnetic layer (3 nm), NiFe as the second magnetic layer (15 nm) and NiO as the antiferromagnetic layer (15 nm), there were obtained the inverted magnetic field of 2 Oe and the rate of change of magnetoresistance of 5.5% for the second magnetic layer. The reproducing output value of the shield reproducing head and that of the yoke reproducing head were 800 μV and 810 μV, respectively.

(e) When a spin valve film was produced in the structure as shown in FIG. 5 using glass as the substrate, NiFe as the first magnetic layer (15 nm), Ag as the non-magnetic layer (3 nm), NiFe as the second magnetic layer (15 nm) and NiO as the antiferromagnetic layer (15 nm), there were obtained the inverted magnetic field of 5 Oe and the rate of change of magnetoresistance of 5% for the second magnetic layer. The reproducing output value of the shield reproducing head and that of the yoke reproducing head were 680 μV and 740 μV, respectively.

(f) When a spin valve film was produced in the structure as shown in FIG. 6 using glass as the substrate, Hf as the buffer layer (10 nm), NiFe as the first magnetic layer (15 nm), Ag as the non-magnetic layer (3 nm), NiFe as the second magnetic layer (15 nm) and NiO as the antiferromagnetic layer (15 nm), there were obtained the inverted magnetic field of 6 Oe and the rate of change of magnetoresistance of 5% for the second magnetic layer. The reproducing output value of the shield reproducing head and that of the yoke reproducing head were 720 μV and 750 μV, respectively.

(g) When a spin valve film was produced in the structure as shown in FIG. 7 using glass as the substrate, NiFe as the first magnetic layer (15 nm), Ag as the non-magnetic layer (3 nm), NiFe as the second magnetic layer (15 nm), NiO as the antiferromagnetic layer (15 nm) and Cu as the protective layer (2 nm), there were obtained the inverted magnetic field of 7 Oe and the rate of change of magnetoresistance of 5.5% for the second magnetic layer. The reproducing output value of the shield reproducing head and that of the yoke reproducing head were 810 μV and 830 μV, respectively.

(h) When a spin valve film was produced in the structure as shown in FIG. 8 using glass as the substrate, Hf as the buffer layer (10 nm), NiFe as the first magnetic layer (15 nm), Ag as the non-magnetic layer (3 nm), NiFe as the second magnetic layer (15 nm), NiO as the antiferromagnetic layer (15 nm) and Cu as the protective layer (2 nm), there were obtained the inverted magnetic field of 4Oe and the rate of change of magnetoresistance of 5.5% for the second magnetic layer. The reproducing output value of the shield reproducing head and that of the yoke reproducing head were 760 μV and 840 μV, respectively.

EXAMPLE 9

In the structure as shown in FIG. 1, a spin valve film was produced by using the first magnetic layer of (1) or (2) given below and changing its film thickness. A shield reproducing head and a yoke reproducing head were manufactured by use of this spin valve film. Then, reading tests were performed on the magnetic domain having a width of 0.3 gm recorded on a commercially available hard disk by use of an inductive head.

(1) In the case where FeSiAl is used for the first magnetic layer:

a spin valve film was produced using glass as the substrate, Hf as the buffer layer (10 nm), Cu as the non-magnetic layer (3 nm), FeSiAl as the second magnetic layer (17 nm), NiO as the antiferromagnetic layer (15 nm) and Cu as the protective layer (2 nm) and by changing the film thickness of the FeSiAl first magnetic layer as shown in Table 16. The values of the reproducing output are also shown in Table 16.

Table 16

(2) In the case where NiFe is used for the first magnetic layer:

a spin valve film was produced using glass as the substrate, SiO$_2$ as the buffer layer (80 nm), Cu as the non-magnetic layer (3 nm), NiFe as the second magnetic layer (15 nm), FeMn as the antiferromagnetic layer (15 nm) and SiO$_2$ as the protective layer (80 nm) and by changing the film thickness of the NiFe first magnetic layer as shown in Table 17. The values of the reproducing output are also shown in Table 17.

Table 17

EXAMPLE 10

In the structure as shown in FIG. 1, a spin valve film was produced by using the second magnetic layer of (1) or (2) given below and changing its film thickness. The values of reproducing outputs of a shield reproducing head and a yoke reproducing head were measured in the same manner as in Example 9.

(1) In the case where CoZrNb is used for the second magnetic layer:

a spin valve film was produced using glass as the substrate, Ta as the buffer layer (10 nm), Cu as the non-magnetic layer (3 nm), CoZrMo as the first magnetic layer (15 nm), NiO as the antiferromagnetic layer (15 nm) and Cu as the protective layer (2 nm) and by changing the film thickness of the CoZrMb second magnetic layer as shown in Table 18. The values of the reproducing outputs of the shield and yoke reproducing heads are also shown in Table 18, respectively.

Table 18

(2) In the case where NiFe is used for the second magnetic layer:

a spin valve film was produced using glass as the substrate, Al$_2$O$_3$ as the buffer layer (30 nm), Cu as the non-magnetic layer (3 nm), NiFe as the first magnetic layer (15 nm), FeMn as the antiferromagnetic layer (15 nm) and Al$_2$O$_3$ as the protective layer (50 nm) and by changing the film thickness of the NiFe second magnetic layer as shown in Table 19. The values of the reproducing outputs of the shield and yoke reproducing heads are also shown in Table 19, respectively.

Table 19

EXAMPLE 11

In the structure as shown in FIG. 1, a spin valve film was produced by using the non-magnetic layer of (1) or (2) given below and changing its film thickness. The values of reproducing outputs of a shield reproducing head and a yoke reproducing head were measured in the same manner as in Example 9.

(1) In the case where Cu is used for the non-magnetic layer:

a spin valve film was produced using glass as the substrate, Cr as the buffer layer (10 nm), NiFe as the first magnetic layer (17 nm), FeSiAl as the second magnetic layer (15 nm), NiO as the antiferromagnetic layer (15 nm) and Cu as the protective layer (2 nm) and by changing the film thickness of the Cu non-magnetic layer as shown in Table 20. The values of the reproducing outputs of the shield and yoke reproducing heads are also shown in Table 20, respectively.

Table 20

(2) In the case where Al is used for the non-magnetic layer:

a spin valve film was produced using glass as the substrate, AlN as the buffer layer (30 nm), CoZrMo as the first magnetic layer (17 nm), FeSiAl as the second magnetic layer (15 nm), FeMn as the antiferromagnetic layer (15 nm) and SiO$_2$ as the protective layer (30 nm) and by changing the film thickness of the Al non-magnetic layer as shown in Table 21. The values of the reproducing outputs of the shield and yoke reproducing heads are also shown in Table 21, respectively.

Table 21

EXAMPLE 12

In the structure as shown in FIG. 1, a spin valve film was produced by using the antiferromagnetic layer of (1) or (2) given below and changing its film thickness. The values of reproducing outputs of a shield reproducing head and a yoke reproducing head were measured in the same manner as in Example 9.

(1) In the case where FeMn is used for the antiferromagnetic layer:

a spin valve film was produced using glass as the substrate, Ta as the buffer layer (10 nm), NiFe as the first magnetic layer (18 nm), Cu as the non-magnetic layer (3 nm), NiFe as the second magnetic layer (14 nm) and Cu as the protective layer (2 nm) and by changing the film thickness of the FeMn ferromagnetic layer as shown in Table 22. The values of the reproducing outputs of the shield and yoke reproducing heads are also shown in Table 22, respectively.

Table 22

(2) In the case where a mixture of NiO, CoO, and FeO is used for the antiferromagnetic layer:

a spin valve film was produced using glass as the substrate, Pt as the buffer layer (10 nm), FeSiAl as the first magnetic layer (16 nm), Ag as the non-magnetic layer (3 nm), NiFe as the second magnetic layer (18 nm) and Pt as the protective layer (2 nm) and by changing the film thickness of the ferromagnetic layer formed of NiO, CoO and FeO as shown in Table 23. The values of the reproducing outputs of the shield and yoke reproducing heads are also shown in Table 23, respectively.

Table 23

EXAMPLE 13

In the structure as shown in FIG. 1, a spin valve film was produced by using the metallic protective layer of (1) or (2) given below and changing its film thickness. The values of reproducing outputs of a shield reproducing head and a yoke reproducing head were measured in the same manner as in Example 9.

(1) In the case where Cu is used for the metallic protective layer:

a spin valve film was produced using glass as the substrate, Mo as the buffer layer (10 nm), NiFe as the first magnetic layer (15 nm), Cu as the non-magnetic layer (3 nm), NiFe as the second magnetic layer (15 nm), FeMn as the antiferromagnetic layer (15 nm) and Cu as the protective layer and by changing the film thickness of the Cu protective layer as shown in Table 24. The values of the reproducing outputs of the shield and yoke reproducing heads are also shown in Table 24, respectively.

Table 24

(2) In the case where an AgTi alloy is used for the metallic protective layer:

a spin valve film was produced using glass as the substrate, $Si_3N_4$ as the buffer layer (50 nm), SiAlTi as the first magnetic layer (13 nm), Au as the non-magnetic layer (3 nm), NiFe as the second magnetic layer (15 nm), FeMn as the antiferromagnetic layer (15 nm) and AgTi alloy as the protective layer and by changing the film thickness of the AgTi alloy protective layer as shown in Table 25. The values of the reproducing outputs of the shield and yoke reproducing heads are also shown in Table 25, respectively.

Table 25

EXAMPLE 14

In the structure as shown in FIG. 1, a spin valve film was produced by using the non-metallic protective layer of (1) or (2) given below and changing its film thickness. The values of reproducing outputs of a shield reproducing head and a yoke reproducing head were measured in the same manner as in Example 9.

(1) In the case where $Si_3N_4$ is used for the non-metallic protective layer:

a spin valve film was produced in the structure shown in FIG. 1 using glass as the substrate, $Si_3N_4$ as the buffer layer (80 nm), NiFe as the first magnetic layer (15 nm), Cu as the non-magnetic layer (3 nm), NiFe as the second magnetic layer (15 nm), FeMn as the antiferromagnetic layer (15 nm) and $Si_3N_4$ as the protective layer and by changing the film thickness of the $Si_3N_4$ protective layer as shown in Table 26. The values of the reproducing outputs of the shield and yoke reproducing heads are also shown in Table 26, respectively.

Even when the film thickness of the protective layer is varied as described above, there are almost no changes in the head reproducing outputs. However, if the film thickness is made less than 2 nm, the FeMn antiferromagnetic layer is conspicuously oxidized, thus causing a problem with respect to reliability.

Table 26

(2) In the case where an $Al_2O_3$ alloy is used for the non-metallic protective layer:

a spin valve film was produced using glass as the substrate, $Al_2O_3$ as the buffer layer (80 nm), FeSiAl as the first magnetic layer (14 nm), Cu as the non-magnetic layer (3 nm), NiFe as the second magnetic layer (16 nm), FeMn as the antiferromagnetic layer (15 nm) and $Al_2O_3$ as the protective layer and by changing the film thickness of the $Al_2O_3$ protective layer as shown in Table 27. The values of the reproducing outputs of the shield and yoke reproducing heads are also shown in Table 27, respectively.

Even when the film thickness of the protective layer is varied as described above, almost no changes are found in the head reproducing outputs. However, if the film thickness is made less than 2 nm, there is a tendency that the FeMn antiferromagnetic layer is conspicuously oxidized.

Table 27

EXAMPLE 15

In the structure as shown in FIG. 1, a spin valve film was produced by using the metallic buffer layer of (1) or (2) given below and changing its film thickness. The values of reproducing outputs of a shield reproducing head and a yoke reproducing head were measured in the same manner as in Example 9.

(1) In the case where a CuPtAuAg alloy is used for the metallic buffer layer:

a spin valve film was produced using glass as the substrate, CuPtAuAg alloy as the buffer layer, NiFe as the first magnetic layer (15 nm), Cu as the non-magnetic layer (3 nm), NiFe as the second magnetic layer (15 nm), FeMn as the antiferromagnetic layer (15 nm) and $Si_3N_4$ as the protective layer (50 nm) and by changing the film thickness of the CuPtAuAg alloy buffer layer as shown in Table 28. The values of the reproducing outputs of the shield and yoke reproducing heads are also shown in Table 28, respectively.

Table 28

(2) In the case where Ta is used for the metallic buffer layer:

a spin valve film was produced using glass as the substrate, Ta as the buffer layer, CoZrMo as the first magnetic layer (15 nm), Ag as the non-magnetic layer (3 nm), NiFe as the second magnetic layer (15 nm), FeMn as the antiferromagnetic layer (15 nm) and $Si_3N_4$ as the protective layer (50 nm) and by changing the film thickness of the buffer layer as shown in Table 29. The values of the reproducing outputs of the shield and yoke reproducing heads are also shown in Table 29, respectively.

Table 29

EXAMPLE 16

In the structure as shown in FIG. 1, a spin valve film was produced by using the non-metallic buffer layer of (1) or (2)

given below and changing its film thickness. The values of reproducing outputs of a shield reproducing head and a yoke reproducing head were measured in the same manner as in Example 9.

(1) In the case where $Si_3N_4$ is used for the metallic buffer layer:

a spin valve film was produced using $SiO_2$ as the substrate, $Si_3N_4$ as the buffer layer, NiFe as the first magnetic layer (15 nm), Cu as the non-magnetic layer (3 nm), NiFe as the second magnetic layer (15 nm), FeMn as the antiferromagnetic layer (15 nm) and $Si_3N_4$ as the protective layer (50 nm) and by changing the film thickness of the buffer layer as shown in Table 30. The values of the reproducing outputs of the shield and yoke reproducing heads are also shown in Table 30, respectively.

Table 30

(2) In the case where a mixture of $SiO_2$, $Si_3N_4$, AlN, and $Al_2O_3$ is used for the non-metallic buffer layer:

a spin valve film was produced using garnet as the substrate, a mixture of $SiO_2$, $Si_3N_4$, AlN and $Al_2O_3$ as the buffer layer, FeSi as the first magnetic layer (15 nm), Cu as the non-magnetic layer (3 nm), NiFe as the second magnetic layer (15 nm), FeMn as the antiferromagnetic layer (15 nm) and AlN as the protective layer (60 nm) and by changing the film thickness of the buffer layer as shown in Table 31. The values of the reproducing outputs of the shield and yoke reproducing heads are also shown in Table 31, respectively.

Table 31

EXAMPLE 17

In the structure as shown in FIG. 1, the magnetic layers were formed under the conditions of (1) to (5) given below. The inverted magnetic field and the rate of change of the magnetoresistance of the second magnetic layer were measured.

Then, a shield reproducing head and a yoke reproducing head were manufactured by use of a spin valve film thus produced. Reading tests were performed on the magnetic domain having a width of 0.3 $\mu$m recorded on a commercially available hard disk by use of an inductive head. Then, the values of reproducing output were obtained.

(1) In the case where a double-layered film is used for the first magnetic layer:

When a spin valve film was produced using $Al_2O_3$ as the substrate, Ti as the buffer layer (10 nm), a double-layered film of CoZrMo (5 nm)/CoZrNb (10 nm) as the first magnetic layer, Cu as the non-magnetic layer (3.5 nm), CoZrNb as the second magnetic layer (15 nm), NiO as the antiferromagnetic layer (15 nm) and Cu as the protective layer (2 nm), there were obtained the inverted magnetic field of 1 Oe and the rate of change of magnetoresistance of 7% for the second magnetic layer. The reproducing output value of the shield reproducing head and that of the yoke reproducing head were 930 $\mu$V and 970 $\mu$V, respectively.

(2) In the case where an eight-layered film is used for the first magnetic layer:

When a spin valve film was produced using $Al_2O_3$ as the substrate, Ti as the buffer layer (10 nm), an eight-layered film of (CoZrMo (2 nm)/CoZrNb (2 nm))×4 as the first magnetic layer, Cu as the non-magnetic layer (3 nm), CoZrNb as the second magnetic layer (15 nm), NiO as the antiferromagnetic layer (15 nm) and Cu as the protective layer (2 nm), there were obtained the inverted magnetic field of 1 Oe and the rate of change of magnetoresistance of 8% for the second magnetic layer. The reproducing output value of the shield reproducing head and that of the yoke reproducing head were 1070 $\mu$V and 1130 $\mu$V, respectively.

(3) In the case where a three-layered film is used for the second magnetic layer:

When a spin valve film was produced using glass as the substrate, W as the buffer layer (10 nm), FeSiAl as the first magnetic layer (15 nm), Cu as the non-magnetic layer (3 nm), a three-layered film of FeNi (5 nm)/ FeSiAl (5 nm)/FeSi (5 nm) as the second magnetic layer, FeMn as the antiferromagnetic layer (15 nm) and Cu as the protective layer (2 nm), there were obtained the inverted magnetic field of 1 Oe and the rate of change of magnetoresistance of 6.5% for the second magnetic layer. The reproducing output value of the shield reproducing head and that of the yoke reproducing head were 910 $\mu$V and 940 $\mu$V, respectively.

(4) In the case where a 16-layered film is used for the second magnetic layer:

When a spin valve film was produced using glass as the substrate, W as the buffer layer (10 nm), FeSiAl as the first magnetic layer (15 nm), Cu as the non-magnetic layer (3 nm), a 16-layered film of (FeNi (1 nm)/FeSiAl (1 nm))×8 as the second magnetic layer, FeMn as the antiferromagnetic layer (15 nm) and Cu as the protective layer (2 nm), there were obtained the inverted magnetic field of 1 Oe and the rate of change of magnetoresistance of 7% for the second magnetic layer. The reproducing output value of the shield reproducing head and that of the yoke reproducing head were 950 $\mu$V and 930 $\mu$V, respectively.

(5) In the case where a 16-layered film is used for the first magnetic layer and another 16-layered film is used for the second magnetic layer:

When a spin valve film was produced using glass as the substrate, $Si_3N_4$ as the buffer layer (80 nm), a 16-layered film of (NiFe (1 nm)/FeSiAl (1 nm))×8 as the first magnetic layer, Cu as the non-magnetic layer (3 nm), a 16-layered film of (FeNi (1 nm)/FeSiAl (1 nm))×8 for the second magnetic layer, FeMn as the antiferromagnetic layer (15 nm) and Cu as the protective layer (2 nm), there were obtained the inverted magnetic field of 1 Oe and the rate of change of magnetoresistance of 9% for the second magnetic layer. The reproducing output value of the shield reproducing head and that of the yoke reproducing head were 1270 $\mu$V and 1300 $\mu$V, respectively.

EXAMPLE 18

In the structure shown in FIG. 1, the non-magnetic layers were formed under the conditions of (1) and (2) given below. The inverted magnetic field and the rate of change of the magnetoresistance of the second magnetic layer were measured. Also, the reproducing output value of the shield reproducing head and that of the yoke reproducing head were measured in the same manner as in Example 17.

(1) In the case where a double-layered film is used for the non-magnetic layer:

When a spin valve film was produced using glass as the substrate, $Si_3N_4$ as the buffer layer (80 nm), a 16-layered film of (NiFe (1 nm)/FeSiAl (1 nm))×8 as the first magnetic layer, a double-layered film of Au (1.5 nm)/Ag (1.5 nm) as the non-magnetic layer, a 16-layered film of (FeNi (1 nm)/FeSiAl (1 nm))×8 as the second magnetic layer, FeMn as the antiferromagnetic layer (15 nm) and Cu as the protective layer, there were obtained the inverted magnetic field of 1Oe and the rate of change of magnetoresistance of 9.5% of the second magnetic layer. The reproducing output value of the shield reproducing head and that of the yoke reproducing head were 1290 $\mu$V and 1330 $\mu$V, respectively.

(2) In the case where a three-layered film is used for the non-magnetic layer:

When a spin valve film was produced using glass as the substrate, $Si_3N_4$ as the buffer layer (80 nm), a 16-layered film of (NiFe (1 nm)/FeSiAl (1 nm))×8 as the first magnetic layer, a three-layered film of Ag (1 nm)/Cu (1 nm)/Ag (1 nm) as the non-magnetic layer, a 16-layered film of (FeNi (1 nm)/FeSiAl (1 nm))×8 as the second magnetic layer, FeMn as the antiferromagnetic layer (15 nm) and Cu as the protective layer (2 nm), there were obtained the inverted magnetic field of 1e and the rate of change of magnetoresistance of 9.5% of the second magnetic layer. The reproducing output value of the shield reproducing head and that of the yoke reproducing head were 1270 $\mu$V and 1310 $\mu$V, respectively.

EXAMPLE 19

In the structure shown in FIG. 1, the antiferromagnetic layers were formed under the conditions of (1) and (2) given below. The inverted magnetic field and the rate of change of the magnetoresistance of the second magnetic layer were measured. Also, the reproducing output value of the shield reproducing head and that of the yoke reproducing head were measured in the same manner as in Example 17.

(1) In the case where a double-layered film is used for the antiferromagnetic layer:

When a spin valve film was produced using glass as the substrate, Hf as the buffer layer (10 nm), NiFe as the first magnetic layer (15 nm), Cu as the non-magnetic layer (3 nm), FeNi as the second magnetic layer (15 nm), a double-layered film of NiO (10 nm)/CoO (10 nm) as the antiferromagnetic layer and Cu as the protective layer (2 nm), there were obtained the inverted magnetic field of 2Oe and the rate of change of magnetoresistance of 7.5%. The reproducing output value of the shield reproducing head and that of the yoke reproducing head were 910 $\mu$V and 920 $\mu$V, respectively.

(2) In the case where a three-layered film is used for the antiferromagnetic layer:

When a spin valve film was produced using glass as the substrate, Hf as the buffer layer (10 nm), FeSiAl as the first magnetic layer (15 nm), Pt as the non-magnetic layer (3 nm), FeNi as the second magnetic layer (15 nm), a three-layered film of NiO (5 nm)/FeMn (5 nm)/NiO (5 nm) as the antiferromagnetic layer and Cu as the protective layer (2 nm), there were obtained the inverted magnetic field of 2Oe and the rate of change of magnetoresistance of 8%. The reproducing output value of the shield reproducing head and that of the yoke reproducing head were 970 $\mu$V and 940 $\mu$V, respectively.

EXAMPLE 20

In the structure shown in FIG. 1, the buffer layers were formed under the conditions of (1) and (2) given below. The inverted magnetic field and the rate of change of the magnetoresistance of the second magnetic layer were measured. Also, the reproducing output value of the shield reproducing head and that of the yoke reproducing head were measured in the same manner as in Example 17.

(1) In the case where a double-layered film is used for the buffer layer:

When a spin valve film was produced using polycarbonate as the substrate, a double-layered film of $Si_3N_4$ (50 nm)/Hf (10 nm) as the buffer layer, NiFe as the first magnetic layer (15 nm), Cu as the non-magnetic layer (3 nm), FeNi as the second magnetic layer (15 nm), a double-layered film of NiO (10 nm)/CoO (10 nm) as the antiferromagnetic layer and Cu as the protective layer (2 nm), there were obtained the inverted magnetic field of 1Oe and the rate of change of magnetoresistance of 8% of the second magnetic layer. The reproducing output value of the shield reproducing head and that of the yoke reproducing head were 980 $\mu$V and 960 $\mu$V, respectively.

(2) When a three-layered film is used for the buffer layer:

When a spin valve film was produced using polycarbonate as the substrate, a three-layered film of $Si_3N_4$ (50 nm)/Hf (5 nm)/Ta (5 nm) as the buffer layer, NiFe as the first magnetic layer (15 nm), Cu as the non-magnetic layer (3 nm), FeNi as the second magnetic layer (15 nm), a double-layered film of NiO (10 nm)/CoO (10 nm) as the antiferromagnetic layer and Cu as the protective layer (2 nm), there were obtained the inverted magnetic field of 1Oe and the rate of change of magnetoresistance of 9% of the second magnetic layer. The reproducing output value of the shield reproducing head and that of the yoke reproducing head were 1260 $\mu$V and 1290 $\mu$V, respectively.

EXAMPLE 21

In the structure shown in FIG. 1, the protective layers were formed under the conditions of (1) and (2) given below. The inverted magnetic field and the rate of change of the magnetoresistance of the second magnetic layer were measured. Also, the reproducing output value of the shield reproducing head and that of the yoke reproducing head were measured in the same manner as in Example 17.

(1) In the case where a double-layered film is used for the protective layer:

When a spin valve film was produced using glass as the substrate, a double-layered film of $Si_3N_4$ (50 nm)/Hf (10 nm) as the buffer layer, Cu as the non-magnetic layer (3 nm), FeNi as the second magnetic layer (15 nm), NiO as the antiferromagnetic layer (15 nm) and a double-layered film of Cu (2 nm)/$Si_3N_4$ (50 nm) as the protective layer, there were obtained the inverted magnetic field of 1Oe and the rate of change of magnetoresistance of 8% of the second magnetic layer. The reproducing output value of the shield reproducing head and that of the yoke reproducing head were 970 $\mu$V and 950 $\mu$V, respectively.

(2) When a three-layered film is used for the protective layer:

When a spin valve film was produced using glass as the substrate, a double-layered film of $Si_3N_4$ (50 nm)/Hf (10 nm) as the buffer layer, NiFe as the first magnetic layer (15 nm), Cu as the non-magnetic layer (3 nm), FeNi as the second magnetic layer (15 nm), FeMn as the antiferromagnetic layer (15 nm) and a three-layered film of Cu (2 nm)/$Si_3N_4$ (50 nm)/ an ultraviolet-curing resin (500 nm) as the protective layer, there were obtained the inverted magnetic field of 1Oe and the rate of change of magnetoresistance of 8% of the second magnetic layer. The reproducing output value of the shield reproducing head and that of the yoke reproducing head were 950 μV and 950 μV, respectively.

EXAMPLE 22

In the structure shown in FIG. 1, the substrates of the following conditions (1) and (2) were used to measure the inverted magnetic field and the rate of change of the magnetoresistance of the second magnetic layer. Also, the reproducing output value of the shield reproducing head and that of the yoke reproducing head were measured in the same manner as in Example 17.

(1) In the case where a double-layered substrate is used:

When a spin valve film was produced using glass/SiO$_2$ as the substrate, Hf as the buffer layer (10 nm), NiFe as the first magnetic layer (15 nm), Cu as the non-magnetic layer (3 nm), FeNi as the second magnetic layer (15 nm), NiO as the antiferromagnetic layer (15 nm) and Cu as the protective layer (2 nm), there were obtained the inverted magnetic field of 1Oe and the rate of change of magnetoresistance of 7% of the second magnetic layer. The reproducing output value of the shield reproducing head and that of the yoke reproducing head were 920 μV and 950 μV, respectively.

(2) In the case where another double-layered substrate is used:

When a spin valve film was produced using glass/UV-curing resin as the substrate, a double-layered film of SiO$_2$ (70 nm)/Hf (10 nm) as the buffer layer, NiFe as the first magnetic layer (15 nm), Cu as the non-magnetic layer (3 nm), FeNi as the second magnetic layer (15 nm), NiO as the antiferromagnetic layer (15 nm) and Cu as the protective layer (2 nm), there were obtained the inverted magnetic field of 1Oe and the rate of change of magnetoresistance of 7% of the second magnetic layer. The reproducing output value of the shield reproducing head and that of the yoke reproducing head were 940 μV and 910 μV, respectively.

As described above, according to the application of the present invention, a thin film having a good sensitivity with respect to magnetic field and a significant magnetoresistive effect can be obtained. When using this thin film for a shield reproducing head or a yoke reproducing head, the maximum reproducing output obtainable is approximately four times that of a reproducing head which utilizes the magnetoresistive effect provided by the application of the prior art.

[TABLE 1]

| First magnetic layer | Second magnetic layer | Second magnetic layer inverted magnetic field (Oe) | Rate of change in magnetoresistance | Shield head reproducing output (μV) | Yoke head reproducing output (μV) |
|---|---|---|---|---|---|
| CoZrNb | CoZrNb | 1 | 4 | 800 | 740 |
| CoZrMo | CoZrMo | 1 | 3.5 | 730 | 690 |
| FeSiAl | FeSiAl | 2 | 5 | 940 | 920 |
| FeSi | FeSi | 10 | 5 | 570 | 490 |
| NiFe | NiFe | 2 | 4 | 770 | 730 |
| NiFe | FeSiAl | 2 | 5 | 980 | 910 |
| FeSiAl | NiFe | 2 | 4 | 790 | 770 |
| NiFe | CoZrNb | 1 | 4 | 880 | 810 |

[TABLE 1]-continued

| First magnetic layer | Second magnetic layer | Second magnetic layer inverted magnetic field (Oe) | Rate of change in magnetoresistance | Shield head reproducing output (μV) | Yoke head reproducing output (μV) |
|---|---|---|---|---|---|
| FeSiAl | CoZrNb | 3 | 4 | 760 | 720 |
| CoZrNb | CoZrMo | 1 | 4.5 | 1050 | 970 |

[TABLE 2]

| First magnetic layer | Second magnetic layer | Second magnetic layer inverted magnetic field (Oe) | Rate of change in magnetoresistance | Shield head reproducing output (μV) | Yoke head reproducing output (μV) |
|---|---|---|---|---|---|
| CoZrNb | CoZrNb | 2 | 5 | 930 | 860 |
| COZrMo | CoZrMo | 1 | 3.5 | 810 | 670 |
| FeSiAl | FeSiAl | 3 | 6 | 1070 | 980 |
| FeSi | FeSi | 9 | 5 | 670 | 570 |
| NiFe | NiFe | 2 | 4.5 | 820 | 770 |
| NiFe | FeSiAl | 3 | 4.5 | 970 | 920 |
| FeSiAl | NiFe | 1 | 4 | 870 | 810 |
| NiFe | CoZrNb | 2 | 4 | 870 | 820 |
| FeSiAl | CoZrNb | 4 | 5 | 790 | 790 |
| CoZrNb | CoZrMo | 2 | 4.5 | 1070 | 1060 |

[TABLE 3]

| First magnetic layer | Second magnetic layer | Second magnetic layer inverted magnetic field (Oe) | Rate of change in magnetoresistance | Shield head reproducing output (μV) | Yoke head reproducing output (μV) |
|---|---|---|---|---|---|
| CoZrNb | CoZrNb | 1 | 4 | 870 | 900 |
| CoZrMo | CoZrMo | 1 | 3 | 800 | 820 |
| FeSiAl | FeSiAl | 2 | 7 | 900 | 930 |
| FeSi | FeSi | 10 | 5 | 650 | 670 |
| NiFe | NiFe | 2 | 4 | 790 | 810 |
| NiFe | FeSiAl | 1 | 4 | 930 | 990 |
| FeSiAl | NiFe | 1 | 4.5 | 880 | 940 |
| NiFe | CoZrNb | 1 | 3.5 | 870 | 870 |
| FeSiAl | CoZrNb | 3 | 4 | 810 | 860 |
| CoZrNb | CoZrMo | 1 | 4 | 990 | 1070 |

[TABLE 4]

| Non-magnetic layer | Second magnetic layer inverted magnetic field (Oe) | Rate of change in magnetoresistance | Shield head reproducing output (μV) | Yoke head reproducing output (μV) |
|---|---|---|---|---|
| Cu | 1 | 5 | 990 | 1040 |
| Al | 2 | 4.5 | 910 | 1000 |
| Si | 4 | 3.5 | 810 | 880 |
| Ti | 3 | 5 | 850 | 880 |
| V | 3.5 | 4 | 790 | 850 |
| Zn | 7 | 3.5 | 680 | 690 |
| Zr | 1 | 4.5 | 880 | 990 |
| Nb | 10 | 2 | 330 | 380 |
| Mo | 3 | 5.5 | 910 | 900 |

[TABLE 4]-continued

| Non-magnetic layer | Second magnetic layer inverted magnetic field (Oe) | Rate of change in magneto-resistance | Shield head reproducing output (μV) | Yoke head reproducing output (μV) |
|---|---|---|---|---|
| Pd | 2 | 4.5 | 930 | 940 |
| Ag | 1 | 6 | 1100 | 1130 |
| Sn | 5 | 4 | 810 | 860 |
| Hf | 2 | 5 | 860 | 920 |
| Ir | 1 | 7 | 1120 | 1150 |
| Ta | 1 | 4.5 | 900 | 890 |
| W | 2 | 4 | 890 | 910 |
| Pt | 1 | 5 | 960 | 990 |
| Au | 1 | 7 | 1270 | 1330 |
| Pb | 10 | 3 | 290 | 310 |
| Bi | 20 | 3.5 | 220 | 230 |
| C | 9 | 2 | 270 | 300 |
| SiC | 7 | 2.5 | 260 | 270 |

[TABLE 5]

| Non-magnetic layer | Second magnetic layer inverted magnetic field (Oe) | Rate of change in magneto-resistance | Shield head reproducing output (μV) | Yoke head reproducing output (μV) |
|---|---|---|---|---|
| Cu | 3 | 4 | 550 | 590 |
| Al | 4 | 3.5 | 670 | 660 |
| Si | 5 | 3 | 470 | 460 |
| Ti | 7 | 4 | 460 | 420 |
| V | 8 | 3 | 390 | 420 |
| Zn | 17 | 3 | 260 | 280 |
| Zr | 6 | 3.5 | 460 | 490 |
| Nb | 25 | 2.5 | 170 | 190 |
| Mo | 6 | 5 | 670 | 660 |
| Pd | 4 | 4 | 720 | 690 |
| Ag | 3 | 5 | 820 | 870 |
| Sn | 6 | 3 | 680 | 750 |
| Hf | 7 | 4 | 620 | 690 |
| Ta | 4 | 5.5 | 860 | 870 |
| W | 6 | 4 | 790 | 810 |
| Pt | 2 | 4.5 | 810 | 910 |
| Au | 5 | 5 | 760 | 750 |
| Pb | 16 | 2.5 | 280 | 280 |
| Bi | 30 | 3 | 140 | 190 |
| C | 12 | 2.5 | 160 | 210 |
| SiC | 7 | 2.5 | 280 | 330 |

[TABLE 6]

| Antiferro-magnetic layer | Second magnetic layer inverted magnetic field (Oe) | Rate of change in magneto-resistance | Shield head reproducing output (μV) | Yoke head reproducing output (μV) |
|---|---|---|---|---|
| FeMn | 1 | 5 | 880 | 930 |
| NiO | 4 | 4.5 | 770 | 790 |
| NiO + CoO | 3 | 4.5 | 790 | 830 |
| NiO + FeO | 3 | 4 | 820 | 880 |
| Fe₂O₃ | 6 | 3 | 380 | 390 |
| MnO | 4 | 4 | 760 | 850 |
| CrO | 1 | 6.5 | 920 | 960 |
| Cr | 3 | 2.5 | 460 | 400 |
| Mn | 5 | 3 | 490 | 520 |

[TABLE 7]

| Antiferro-magnetic layer | Second magnetic layer inverted magnetic field (Oe) | Rate of change in magneto-resistance | Shield head reproducing output (μV) | Yoke head reproducing output (μV) |
|---|---|---|---|---|
| FeMn | 2 | 6 | 830 | 800 |
| NiO | 3 | 5.5 | 810 | 790 |
| NiO + CoO | 2 | 4.5 | 770 | 810 |
| NiO + FeO | 4 | 4 | 680 | 760 |
| Fe₂O₃ | 10 | 4 | 480 | 450 |
| MnO | 3 | 4.5 | 620 | 600 |
| CrO | 2 | 5.5 | 940 | 930 |
| Cr | 4 | 3.5 | 570 | 490 |
| Mn | 7 | 3.5 | 470 | 530 |

[TABLE 8]

| Element added to antiferro-magnetic layer | Second magnetic layer inverted magnetic field (Oe) | Rate of change in magneto-resistance | Shield head reproducing output (μV) | Yoke head reproducing output (μV) |
|---|---|---|---|---|
| Mo | 2 | 5 | 730 | 780 |
| W | 3 | 5.5 | 820 | 790 |
| V | 3 | 4.5 | 680 | 740 |
| Nb | 1 | 5 | 990 | 1020 |
| Ta | 4 | 4 | 680 | 690 |
| Ir | 1 | 6 | 1030 | 1070 |
| Mn | 3 | 4.5 | 760 | 750 |
| Tc | 2 | 5.5 | 870 | 990 |
| Re | 1 | 4.5 | 800 | 780 |
| Ru | 3 | 5 | 820 | 790 |
| Rh | 2 | 5 | 820 | 770 |
| Fe | 2 | 5.5 | 810 | 760 |
| Co | 1 | 6 | 960 | 1080 |
| Ni | 3 | 4.5 | 720 | 740 |
| Pt | 2 | 5.5 | 840 | 900 |
| Pd | 3 | 4.5 | 780 | 810 |
| Au | 2 | 5 | 860 | 820 |
| Ag | 1 | 5 | 1000 | 1120 |
| Cu | 1 | 6 | 1270 | 1340 |

[TABLE 9]

| Element added to antiferro-magnetic layer | Second magnetic layer inverted magnetic field (Oe) | Rate of change in magneto-resistance | Shield head reproducing output (μV) | Yoke head reproducing output (μV) |
|---|---|---|---|---|
| Mo | 3 | 5.5 | 780 | 840 |
| W | 2 | 5.5 | 820 | 780 |
| V | 3 | 5 | 740 | 790 |
| Ir | 2 | 6 | 890 | 930 |
| Nb | 2 | 6 | 890 | 1030 |
| Ta | 3 | 6 | 870 | 990 |
| Mn | 2 | 5.5 | 850 | 950 |
| Tc | 4 | 6.5 | 930 | 1040 |
| Re | 2 | 5.5 | 900 | 1050 |
| Ru | 3 | 5 | 810 | 800 |
| Rh | 2 | 6 | 860 | 840 |
| Fe | 3 | 5.5 | 780 | 800 |
| Co | 2 | 5 | 810 | 790 |
| Ni | 2 | 4.5 | 760 | 760 |
| Pt | 3 | 5.5 | 830 | 840 |
| Pd | 2 | 5 | 770 | 840 |

[TABLE 9]-continued

| Element added to antiferromagnetic layer | Second magnetic layer inverted magnetic field (Oe) | Rate of change in magnetoresistance | Shield head reproducing output (μV) | Yoke head reproducing output (μV) |
|---|---|---|---|---|
| Au | 3 | 5 | 770 | 830 |
| Ag | 1 | 6 | 1100 | 1110 |
| Cu | 2 | 6.5 | 1110 | 1170 |

[TABLE 10]

| Buffer layer | Second magnetic layer inverted magnetic field (Oe) | Rate of change in magnetoresistance | Shield head reproducing output (μV) | Yoke head reproducing output (μV) |
|---|---|---|---|---|
| Ta | 2 | 5 | 780 | 750 |
| Hf | 3 | 4.5 | 770 | 730 |
| Si | 7 | 3 | 510 | 490 |
| Au | 4 | 2 | 190 | 180 |
| Pt | 8 | 3 | 350 | 360 |
| Ag | 4 | 4 | 670 | 730 |
| Cu | 8 | 3.5 | 470 | 550 |
| Ti | 17 | 2.5 | 370 | 400 |
| Mn | 13 | 3.5 | 320 | 330 |
| Cr | 14 | 3 | 360 | 390 |
| Al | 5 | 4 | 680 | 660 |
| $Si_3N_4$ | 2 | 6 | 820 | 930 |
| $SiO_2$ | 3 | 6 | 840 | 940 |
| $Al_2O_3$ | 2 | 6.5 | 910 | 970 |
| SiC | 3 | 6 | 870 | 920 |
| C | 10 | 2.5 | 250 | 290 |
| Diamond-like carbon | 3 | 6 | 910 | 970 |

[TABLE 11]

| Buffer layer | Second magnetic layer inverted magnetic field (Oe) | Rate of change in magnetoresistance | Shield head reproducing output (μV) | Yoke head reproducing output (μV) |
|---|---|---|---|---|
| Ta | 1 | 5.5 | 820 | 860 |
| Hf | 2 | 5 | 810 | 770 |
| Si | 18 | 3.5 | 260 | 310 |
| Au | 3 | 4 | 720 | 760 |
| Pt | 3 | 6 | 820 | 900 |
| Ag | 4 | 6.5 | 860 | 890 |
| Cu | 11 | 3.5 | 370 | 350 |
| Ti | 15 | 3 | 220 | 270 |
| Mn | 14 | 3.5 | 280 | 320 |
| Cr | 19 | 2 | 170 | 190 |
| Al | 5 | 6 | 780 | 820 |
| $Si_3N_4$ | 2 | 7 | 1030 | 1080 |
| $SiO_2$ | 3 | 7 | 1020 | 1100 |
| $Al_2O_3$ | 2 | 6.5 | 1010 | 1110 |
| SiC | 2 | 7 | 990 | 1100 |
| C | 12 | 2.5 | 220 | 290 |
| Diamond-like carbon | 3 | 6.5 | 960 | 1090 |

[TABLE 12]

| Protective layer | Thickness (nm) | Second magnetic layer inverted magnetic field (Oe) | Rate of change in magnetoresistance (%) | Shield head reproducing output (μV) | Yoke head reproducing output (μV) |
|---|---|---|---|---|---|
| Ta | 3 | 2 | 5 | 820 | 840 |
| Hf | 3 | 3 | 5.5 | 810 | 850 |
| Si | 40 | 3 | 5 | 850 | 860 |
| Au | 2 | 2 | 5 | 840 | 880 |
| Pt | 2 | 2 | 5.5 | 810 | 870 |
| Ag | 2 | 2 | 6 | 830 | 880 |
| Cu | 2 | 2 | 6 | 850 | 900 |
| Ti | 3 | 3 | 5.5 | 830 | 850 |
| Cr | 3 | 3 | 5 | 840 | 840 |
| Al | 3 | 2 | 5.5 | 830 | 860 |
| $Si_3N_4$ | 50 | 2 | 6 | 820 | 930 |
| $SiO_2$ | 80 | 3 | 6 | 840 | 940 |
| $Al_2O_3$ | 60 | 2 | 6.5 | 910 | 970 |
| SiC | 20 | 3 | 6 | 870 | 920 |
| C | 30 | 4 | 5.5 | 780 | 810 |
| Diamond-like carbon | 20 | 3 | 6.5 | 830 | 880 |
| CuTi | 3 | 2 | 6 | 840 | 850 |
| CuPt | 3 | 2 | 6 | 810 | 860 |
| TaTi | 3 | 2 | 6.5 | 820 | 880 |
| PtAu | 3 | 2 | 6.5 | 830 | 880 |
| AgAu | 2 | 2 | 6 | 820 | 860 |
| CuCr | 3 | 3 | 6 | 810 | 870 |
| Si oxide + Al oxide | 60 | 2 | 6.5 | 820 | 890 |
| Si nitride + Al nitride | 50 | 2 | 6 | 830 | 860 |
| Si nitride + Si oxide | 60 | 2 | 6.5 | 840 | 890 |
| Al nitride + Al oxide | 80 | 3 | 6.5 | 820 | 870 |
| Si oxide + Si nitride Al oxide Al nitride | 50 | 2 | 6.5 | 840 | 900 |

[TABLE 13]

| Protective layer | Thickness (nm) | Second magnetic layer inverted magnetic field (Oe) | Rate of change in magnetoresistance (%) | Shield head reproducing output (μV) | Yoke head reproducing output (μV) |
|---|---|---|---|---|---|
| Ta | 3 | 2 | 6 | 920 | 970 |
| Hf | 3 | 2 | 7 | 1020 | 1070 |
| Si | 40 | 3 | 6.5 | 950 | 1020 |
| Au | 2 | 2 | 6.5 | 970 | 1110 |
| Pt | 2 | 2 | 7 | 1030 | 1090 |
| Ag | 2 | 3 | 6.5 | 900 | 910 |
| Cu | 2 | 2 | 7 | 1090 | 1130 |
| Ti | 3 | 3 | 6.5 | 930 | 940 |
| Cr | 3 | 3 | 6.5 | 940 | 970 |
| Al | 3 | 2 | 6 | 910 | 960 |
| $Si_3N_4$ | 50 | 2 | 7 | 960 | 1130 |
| $SiO_2$ | 80 | 2 | 7 | 990 | 1170 |
| $Al_2O_3$ | 60 | 3 | 6.5 | 910 | 960 |
| SiC | 20 | 2 | 7 | 1100 | 1180 |
| C | 30 | 5 | 6 | 720 | 750 |
| Diamond-like carbon | 20 | 2 | 7 | 900 | 910 |
| CuTi | 3 | 3 | 6.5 | 930 | 970 |
| CuPt | 3 | 2 | 6.5 | 910 | 980 |
| TaTi | 3 | 3 | 6 | 890 | 950 |
| PtAu | 3 | 2 | 7 | 910 | 960 |
| AgAu | 2 | 2 | 7 | 920 | 990 |
| CuCr | 3 | 3 | 6.5 | 820 | 860 |
| Si oxide + | 60 | 2 | 7 | 940 | 960 |

[TABLE 13]-continued

| Protective layer | Thickness (nm) | Second magnetic layer inverted magnetic field (Oe) | Rate of change in magneto-resistance (%) | Shield head reproducing output (μV) | Yoke head reproducing output (μV) |
|---|---|---|---|---|---|
| Al oxide Si nitride + Al nitride | 50 | 2 | 7 | 940 | 970 |
| Si nitride + Si oxide | 60 | 2 | 6.5 | 880 | 920 |
| Al nitride + Al oxide | 80 | 2 | 6.5 | 870 | 870 |
| Si oxide + Si nitride Al oxide Al nitride | 50 | 2 | 7 | 940 | 1040 |

[TABLE 14]

| Substrate | Second magnetic layer inverted magnetic field (Oe) | Rate of change in magneto-resistance (%) | Shield head reproducing output (μV) | Yoke head reproducing output (μV) |
|---|---|---|---|---|
| Glass | 2 | 5.5 | 830 | 870 |
| SiO$_2$ | 3 | 6 | 920 | 990 |
| Si$_3$N$_4$ | 2 | 5.5 | 850 | 880 |
| AlN | 2 | 7 | 1010 | 1130 |
| Al$_2$O$_3$ | 2 | 6.5 | 910 | 940 |
| SiO$_2$ + Si$_3$N$_4$ | 3 | 6.5 | 930 | 970 |
| AlN + Al$_2$O$_3$ | 2 | 6.5 | 940 | 970 |
| Si$_3$N$_4$ + Al$_2$O$_3$ | 3 | 7 | 990 | 1070 |
| Si$_3$N$_4$ + AlN | 2 | 6.5 | 910 | 950 |
| SiO$_2$ + Al$_2$O$_3$ + Si$_3$N$_4$ + AlN | 3 | 7 | 940 | 1040 |
| Ai | 2 | 7 | 680 | 650 |
| Cu | 3 | 7.5 | 690 | 660 |
| W | 2 | 7 | 850 | 830 |
| Ti | 2 | 7 | 840 | 810 |
| Mo | 2 | 7.5 | 880 | 810 |
| NiCr alloy | 3 | 7 | 890 | 840 |
| Zn | 2 | 7 | 880 | 850 |
| CuZn alloy | 2 | 7 | 860 | 830 |
| TiAl alloy | 2 | 6.5 | 780 | 780 |
| Polycarbonate | 8 | 4.5 | 430 | 470 |
| Vinyl chloride | 14 | 4 | 380 | 390 |
| Polyimide | 5 | 5 | 760 | 790 |
| Polyolefin | 7 | 4.5 | 510 | 550 |
| Polycarbonate + polyolefin | 6 | 5.5 | 680 | 720 |

[TABLE 15]

| Substrate | Second magnetic layer inverted magnetic field (Oe) | Rate of change in magneto-resistance (%) | Shield head reproducing output (μV) | Yoke head reproducing output (μV) |
|---|---|---|---|---|
| Glass | 2 | 6.5 | 820 | 860 |
| SiO$_2$ | 2 | 7 | 960 | 980 |
| Si$_3$N$_4$ | 3 | 6.5 | 790 | 810 |
| AlN | 2 | 7.5 | 950 | 980 |
| Al$_2$O$_3$ | 3 | 7 | 970 | 1040 |
| SiO$_2$ + Si$_3$N$_4$ | 2 | 7 | 970 | 1030 |
| AlN + Al$_2$O$_3$ | 2 | 7 | 940 | 1010 |
| Si$_3$O$_2$ + Al$_2$O$_3$ | 3 | 7.5 | 980 | 1090 |
| Si$_3$N$_4$ + AlN | 2 | 7 | 920 | 940 |
| SiO$_2$ + Al$_2$O$_3$ + Si$_3$N$_4$ + AlN | 2 | 7.5 | 1010 | 1040 |
| Al | 2 | 8 | 920 | 990 |
| Cu | 3 | 7.5 | 910 | 1010 |
| W | 2 | 7 | 890 | 930 |
| Ti | 2 | 7.5 | 930 | 1030 |
| Mo | 3 | 7 | 900 | 960 |
| NiCr alloy | 3 | 7 | 890 | 960 |
| Zn | 2 | 6.5 | 810 | 850 |
| CuZn alloy | 2 | 7 | 870 | 910 |
| TiAl alloy | 2 | 7 | 920 | 960 |
| Polycarbonate | 5 | 6 | 630 | 680 |
| Vinyl chloride | 8 | 5 | 580 | 610 |
| Polyimide | 3 | 6 | 770 | 780 |
| Polyolefin | 5 | 5 | 610 | 680 |
| Polycarbonate + polyolefin | 6 | 6 | 710 | 760 |

[TABLE 16]

| Film thickness of first magnetic layer (nm) | Shield head reproducing output (μV) | Yoke head reproducing output (μV) |
|---|---|---|
| 0 | 0 | 0 |
| 5 | 590 | 470 |
| 10 | 900 | 780 |
| 15 | 920 | 850 |
| 20 | 890 | 860 |
| 25 | 850 | 840 |
| 30 | 820 | 800 |
| 35 | 710 | 750 |
| 40 | 600 | 680 |
| 45 | 470 | 570 |

[TABLE 17]

| Film thickness of first magnetic layer (nm) | Shield head reproducing output (μV) | Yoke head reproducing output (μV) |
|---|---|---|
| 0 | 0 | 0 |
| 5 | 420 | 380 |
| 10 | 750 | 690 |
| 15 | 880 | 790 |
| 20 | 960 | 860 |
| 25 | 880 | 850 |
| 30 | 810 | 810 |
| 35 | 680 | 750 |
| 40 | 510 | 650 |
| 45 | 360 | 520 |

[TABLE 18]

| Film thickness of first magnetic layer (nm) | Shield head reproducing output (μV) | Yoke head reproducing output (μV) |
|---|---|---|
| 0 | 0 | 0 |
| 5 | 470 | 420 |
| 10 | 770 | 720 |
| 15 | 920 | 880 |
| 20 | 910 | 950 |
| 25 | 850 | 870 |

[TABLE 18]-continued

| Film thickness of first magnetic layer (nm) | Shield head reproducing output ($\mu$V) | Yoke head reproducing output ($\mu$V) |
| --- | --- | --- |
| 30 | 720 | 810 |
| 35 | 600 | 740 |
| 40 | 440 | 650 |
| 45 | 210 | 470 |

[TABLE 19]

| Film thickness of second magnetic layer (nm) | Shield head reproducing output ($\mu$V) | Yoke head reproducing output ($\mu$V) |
| --- | --- | --- |
| 0 | 0 | 0 |
| 5 | 690 | 560 |
| 10 | 880 | 740 |
| 15 | 900 | 960 |
| 20 | 780 | 820 |
| 25 | 690 | 720 |
| 30 | 560 | 600 |
| 35 | 410 | 480 |
| 40 | 260 | 320 |
| 45 | 190 | 220 |

[TABLE 20]

| Film thickness of nonmagnetic layer (nm) | Shield head reproducing output ($\mu$V) | Yoke head reproducing output ($\mu$V) |
| --- | --- | --- |
| 0 | 0 | 0 |
| 0.5 | 0 | 0 |
| 1.0 | 0 | 0 |
| 1.5 | 260 | 300 |
| 2.0 | 780 | 810 |
| 2.5 | 880 | 890 |
| 3.0 | 920 | 930 |
| 3.5 | 890 | 880 |
| 4.0 | 740 | 770 |
| 4.5 | 690 | 650 |
| 5.0 | 520 | 510 |

[TABLE 21]

| Film thickness of nonmagnetic layer (nm) | Shield head reproducing output ($\mu$V) | Yoke head reproducing output ($\mu$V) |
| --- | --- | --- |
| 0 | 0 | 0 |
| 0.5 | 0 | 0 |
| 1.0 | 0 | 0 |
| 1.5 | 320 | 330 |
| 2.0 | 750 | 790 |
| 2.5 | 840 | 880 |
| 3.0 | 930 | 950 |
| 3.5 | 870 | 840 |
| 4.0 | 760 | 720 |
| 4.5 | 640 | 600 |
| 5.0 | 490 | 470 |

[TABLE 22]

| Film thickness of antiferromagnetic layer (nm) | Shield head reproducing output ($\mu$V) | Yoke head reproducing output ($\mu$V) |
| --- | --- | --- |
| 0 | 0 | 0 |
| 10 | 880 | 890 |

[TABLE 22]-continued

| Film thickness of antiferromagnetic layer (nm) | Shield head reproducing output ($\mu$V) | Yoke head reproducing output ($\mu$V) |
| --- | --- | --- |
| 20 | 900 | 890 |
| 50 | 870 | 860 |
| 100 | 850 | 840 |
| 200 | 830 | 810 |
| 500 | 780 | 760 |
| 1000 | 720 | 730 |

[TABLE 23]

| Film thickness of antiferromagnetic layer (nm) | Shield head reproducing output ($\mu$V) | Yoke head reproducing output ($\mu$V) |
| --- | --- | --- |
| 0 | 0 | 0 |
| 10 | 780 | 770 |
| 20 | 840 | 860 |
| 50 | 870 | 880 |
| 100 | 840 | 850 |
| 200 | 820 | 820 |
| 500 | 800 | 790 |
| 1000 | 780 | 750 |

[TABLE 24]

| Film thickness of Cu protective layer (nm) | Shield head reproducing output ($\mu$V) | Yoke head reproducing output ($\mu$V) |
| --- | --- | --- |
| 0 | 920 | 940 |
| 0.5 | 910 | 950 |
| 1.0 | 920 | 930 |
| 1.5 | 900 | 900 |
| 2.0 | 900 | 920 |
| 2.5 | 890 | 910 |
| 3.0 | 850 | 880 |
| 3.5 | 820 | 840 |
| 4.0 | 760 | 790 |
| 4.5 | 720 | 750 |
| 5.0 | 680 | 690 |

[TABLE 25]

| Film thickness of AgTi alloy protective layer (nm) | Shield head reproducing output ($\mu$V) | Yoke head reproducing output ($\mu$V) |
| --- | --- | --- |
| 0 | 970 | 930 |
| 0.5 | 960 | 950 |
| 1.0 | 960 | 940 |
| 1.5 | 940 | 920 |
| 2.0 | 950 | 900 |
| 2.5 | 920 | 910 |
| 3.0 | 920 | 870 |
| 3.5 | 880 | 810 |
| 4.0 | 790 | 760 |
| 4.5 | 710 | 710 |
| 5.0 | 650 | 630 |

[TABLE 26]

| Film thickness of $Si_3N_4$ protective layer (nm) | Shield head reproducing output ($\mu$V) | Yoke head reproducing output ($\mu$V) |
| --- | --- | --- |
| 0 | 920 | 940 |
| 1 | 910 | 950 |

[TABLE 26]-continued

| Film thickness of Si$_3$N$_4$ protective layer (nm) | Shield head reproducing output ($\mu$V) | Yoke head reproducing output ($\mu$V) |
| --- | --- | --- |
| 2 | 920 | 930 |
| 5 | 900 | 940 |
| 10 | 920 | 920 |
| 20 | 910 | 950 |
| 50 | 920 | 950 |
| 100 | 920 | 940 |

[TABLE 27]

| Film thickness of Al$_2$O$_3$ protective layer (nm) | Shield head reproducing output ($\mu$V) | Yoke head reproducing output ($\mu$V) |
| --- | --- | --- |
| 0 | 930 | 940 |
| 1 | 940 | 940 |
| 2 | 930 | 950 |
| 5 | 940 | 930 |
| 10 | 920 | 920 |
| 20 | 940 | 940 |
| 50 | 920 | 930 |
| 100 | 930 | 920 |

[TABLE 28]

| Film thickness of CuPtAuAg alloy buffer layer (nm) | Shield head reproducing output ($\mu$V) | Yoke head reproducing output ($\mu$V) |
| --- | --- | --- |
| 0 | 920 | 950 |
| 5 | 910 | 940 |
| 10 | 910 | 940 |
| 15 | 890 | 920 |
| 20 | 860 | 850 |
| 25 | 810 | 810 |
| 30 | 760 | 720 |
| 35 | 700 | 660 |

[TABLE 29]

| Film thickness of Ta alloy buffer layer (nm) | Shield head reproducing output ($\mu$V) | Yoke head reproducing output ($\mu$V) |
| --- | --- | --- |
| 0 | 850 | 870 |
| 5 | 840 | 840 |
| 10 | 830 | 840 |
| 15 | 810 | 800 |
| 20 | 780 | 750 |
| 25 | 740 | 720 |
| 30 | 690 | 680 |
| 35 | 640 | 630 |

[TABLE 30]

| Film thickness of Si$_3$N$_4$ buffer layer (nm) | Shield head reproducing output ($\mu$V) | Yoke head reproducing output ($\mu$V) |
| --- | --- | --- |
| 0 | 780 | 790 |
| 5 | 820 | 830 |
| 10 | 850 | 860 |
| 15 | 880 | 890 |
| 20 | 890 | 890 |
| 25 | 910 | 910 |
| 30 | 900 | 900 |

[TABLE 30]-continued

| Film thickness of Si$_3$N$_4$ buffer layer (nm) | Shield head reproducing output ($\mu$V) | Yoke head reproducing output ($\mu$V) |
| --- | --- | --- |
| 35 | 890 | 890 |

[TABLE 31]

| Film thickness of buffer layer (nm) | Shield head reproducing output ($\mu$V) | Yoke head reproducing output ($\mu$V) |
| --- | --- | --- |
| 0 | 740 | 760 |
| 5 | 830 | 840 |
| 10 | 860 | 870 |
| 15 | 850 | 860 |
| 20 | 870 | 890 |
| 25 | 860 | 880 |
| 30 | 880 | 870 |
| 35 | 860 | 890 |

What is claimed is:

1. A spin valve film for a reproduction head for reproducing magnetic records comprising, in order, a first magnetic layer, a non-magnetic layer, a second magnetic layer, and an anti-ferromagnetic layer as the fundamental structure for the film, wherein:

said first magnetic layer comprises a single-layered film or a multi-layered film comprising CoZrNb and said second magnetic layer comprises a single-layered film or a multi-layered film comprising CoZrNb;

said first magnetic layer comprises a single-layered film or a multi-layered film comprising FeSiAl and said second magnetic layer comprises a single-layered film or a multi-layered film comprising FeSiAl; or said first magnetic layer comprises a single-layered film or a multi-layered film comprising CoZrNb and said second magnetic layer comprises a single-layered film or a multi-layered film comprising CoZrMo.

2. The spin valve according to claim 1, wherein a single-layered film or a multi-layered film formed of a single substance selected from the group consisting of Al, Si, Ti, Ir, V, Cu, Zn, Zr, Nb, Mo, Pd, Ag, Sn, Hf, Ta, W, Pt, Au, Pb, Bi, C, silicon carbide and a mixture thereof is used for said non-magnetic layer.

3. The spin valve according to claim 1 or 2, wherein a single-layered film or a multi-layered film formed of a single substance selected from the group consisting of FeMn, NiO, CoO, FeO, Fe$_2$O$_3$, MnO, CrO, Cr, Mn and a mixture thereof or a material prepared by adding to the substance or mixture a substance selected from the group consisting of Mo, W, V, Ir, Nb, Ta, Mn, Tc, Re, Ru, Rh, Fe, Co, Ni, Pt, Pd, Au, Ag and Cu is used as said antiferromagnetic layer.

4. The spin valve film according to claim 3, wherein a single-layered film or a multi-layered film formed of a material to which a substance selected from the group consisting of Cr, Mn, Pt, Ni, Ir, Cu, Ag, Al, Ti, Fe, Co and Zn is added is used for said first or second magnetic layer.

5. The spin valve film according to claim 1, wherein said first magnetic layer comprises a single-layered film or a multi-layered film comprising CoZrNb and said second magnetic layer comprises a single-layered film or a multi-layered film comprising CoZrNb.

6. The spin valve film according to claim 1, wherein said first magnetic layer comprises a single-layered film or a multi-layered film comprising FeSiAl and said second magnetic layer comprises a single-layered film or a multi-layered film comprising FeSiAl.

7. The spin valve film according to claim 1, wherein said first magnetic layer comprises a single-layered film or a multi-layered film comprising CoZrNb and said second magnetic layer comprises a single-layered film or a multi-layered film comprising CoZrMo.

8. A spin valve film for a reproduction head for reproducing magnetic records comprising, in order, a first magnetic layer, a non-magnetic layer, a second magnetic layer, and an anti-ferromagnetic layer as the fundamental structure for the film, wherein said first magnetic layer comprises a single-layered film or a multi-layered film comprising NiFe and said second magnetic layer comprises a single-layered film or a multi-layered film comprising FeSiAl and said non-magnetic layer comprises a single-layered film or a multi-layered film formed of a single substance selected from the group consisting of Al, Si, Ti, Ir, V, Zn, Zr, Nb, Mo, Pd, Ag, Sn, Hf, Ta, W, Pt, Au, Pb, Bi, C, silicon carbide and a mixture thereof.

9. The spin valve according to claim 8, wherein a single substance selected from the group consisting of CoO, FeO, $Fe_2O_3$, MnO, CrO, Cr, Mn and a mixture thereof, or a single-layered film or a multi-layered film of a material prepared by adding to the substance or mixture a substance selected from the group consisting of Mo, W, V, Ir, Nb, Ta, Mn, Tc, Re, Ru, Rh, Fe, Co, Ni, Pt, Pd, Au, Ag and Cu is used as said antiferromagnetic layer.

10. The spin valve film according to claim 1 or 8, wherein said spin valve film comprises a substrate and said first magnetic layer or said antiferromagnetic layer is in contact with said substrate or wherein said spin valve film comprises a substrate and a buffer layer formed on said substrate and said first magnetic layer or said antiferromagnetic layer is in contact with said buffer layer.

11. The spin valve film according to claim 10, wherein a protective layer is formed on the outermost layer.

12. The spin valve according to claim 11, wherein said protective layer comprises a single-layered film or a multi-layered film formed of a substance selected from the group consisting of Ta, Hf, Si, Au, Pt, Ag, Cu, Mn, Ti, Cr, Al, Si nitride, Si oxide, Al oxide, Al nitride, SiC, C, diamond carbon, a mixture thereof and an alloy thereof.

13. The spin valve film according to claim 12, wherein the film thickness of a metallic protective layer is 3 nm or less.

14. The spin valve film according to claim 12, wherein the film thickness of a non-metallic protective layer is 2 nm or more.

15. The spin valve film according to claim 10, wherein said substrate comprises a single-layered film or a multi-layered film formed of a substance selected from the group consisting of glass, ceramic, metal compound, plastic and a mixture thereof.

16. The spin valve film according to claim 10, wherein a single-layered film or a multi-layered film formed of a single substance selected from the group consisting of Ta, Hf, Si, Au, Pt, Ag, Cu, Ti, Mn, Cr, Al, Si nitride, Si oxide, Al oxide, AlN, Al nitride, SiC, C and a mixture thereof is used for said buffer layer.

17. The spin valve film according to claim 16, wherein the film thickness of a metallic buffer layer is 15 nm or less.

18. The spin valve film according to claim 16, wherein the film thickness of a non-metallic buffer layer is 5 nm or more.

19. The spin valve film according to claim 1 or 8, wherein the film thickness of at least one of said first magnetic layer and said second magnetic layer is 5 to 30 nm.

20. The spin valve film according to claim 1 or 8, wherein the film thickness of said non-magnetic layer is 2 to 5 nm.

21. The spin valve film according to claim 1 or 8, wherein the film thickness of said antiferromagnetic layer is 10 to 100 nm.

* * * * *